US006653873B1

(12) United States Patent
Nguyen

(10) Patent No.: US 6,653,873 B1
(45) Date of Patent: Nov. 25, 2003

(54) LARGE LOADING DRIVER CIRCUIT WITH HIGH SPEED AND LOW CROWBAR CURRENT

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/198,942

(22) Filed: Jul. 19, 2002

(51) Int. Cl.[7] ................................................. H03B 1/00
(52) U.S. Cl. ....................... 327/112; 327/108; 327/391; 326/83
(58) Field of Search ........................ 327/227, 108–112, 327/172–176, 178, 261, 263, 264, 276–278, 284, 379, 383, 384, 391, 437; 326/21–24, 26, 27, 82, 83, 85, 89, 91

(56) References Cited

U.S. PATENT DOCUMENTS

| 4,612,466 | A | | 9/1986 | Stewart | |
|---|---|---|---|---|---|
| 4,727,266 | A | * | 2/1988 | Fujii et al. ................... | 326/27 |
| 5,165,046 | A | * | 11/1992 | Hesson ....................... | 327/111 |
| 5,233,238 | A | * | 8/1993 | Mattos ........................ | 326/27 |
| 5,450,019 | A | * | 9/1995 | McClure et al. .............. | 326/28 |
| 5,497,105 | A | * | 3/1996 | Oh et al. ...................... | 326/27 |
| 5,751,180 | A | * | 5/1998 | D'Addeo ..................... | 327/379 |
| 5,801,563 | A | * | 9/1998 | McClure ..................... | 327/170 |
| 5,812,461 | A | * | 9/1998 | Komarek et al. ............ | 365/189.05 |
| 5,894,238 | A | | 4/1999 | Chien | |
| 6,177,819 | B1 | | 1/2001 | Nguyen | |
| 6,570,414 | B1 | * | 5/2003 | Eker ........................... | 327/108 |

* cited by examiner

*Primary Examiner*—Timothy P. Callahan
*Assistant Examiner*—Hai L. Nguyen
(74) *Attorney, Agent, or Firm*—Lois D. Cartier

(57) ABSTRACT

A driver circuit drives heavily loaded signals at high speeds with a reduced crowbar current. One-shots are used to drive the output pullup and pulldown, thereby minimizing the period when both devices are turned on. One embodiment includes an inverter, a one-shot low, a one-shot high, a pullup, and a pulldown. An input signal drives the inverter and the two one-shots. The inverter output terminal is coupled to the driver output terminal, as are the pullup and pulldown. The one-shot low circuit controls the pullup. The one-shot high circuit controls the pulldown. Another embodiment includes two pre-driver circuits, one controlling an output pullup and the other controlling an output pulldown. Each of the pre-driver circuits is implemented using a one-shot low and a one-shot high, as described above. One such embodiment is an output driver for a PLD, and the one-shots include various programmable options.

27 Claims, 21 Drawing Sheets

US 6,653,873 B1

LARGE LOADING DRIVER CIRCUIT WITH HIGH SPEED AND LOW CROWBAR CURRENT

FIELD OF THE INVENTION

The invention relates to high speed circuits for electronic systems. In particular, the invention relates to high speed one-shot circuits and their applications in heavily loaded driver circuits.

BACKGROUND OF THE INVENTION

A one-shot circuit (or "one-shot") is a circuit that provides an output pulse of limited duration in response to an active edge on an input signal. The active edge can be a rising or a falling edge, and the output pulse can be a high pulse or a low pulse. A one-shot that provides a high pulse is referred to herein as a "one-shot high", while a one-shot that provides a low pulse is referred to as a "one-shot low".

One-shots are widely used in integrated circuits (ICs) to provide temporary control signals. For example, signals generated by one-shots are used to turn transistors on or off, latch signals into memory cells, suppress signals or actions to gain additional time to perform other actions, to synchronize signals, and so forth.

FIG. 1 shows a well known one-shot high circuit 100 that provides a high pulse on an output terminal OUT in response to a rising edge on a signal on input terminal IN. The waveforms for circuit 100 are illustrated in FIG. 1A.

One-shot 100 includes a delay line 120, which comprises inverters 101–105 coupled in series, and AND circuit 110, which comprises NAND-gate 106 and inverter 107 also coupled in series. NAND-gate 106 is driven by input terminal IN and by input terminal IN delayed by delay line 120. Inverter 107 provides output signal OUT. Delay line 120 can include any odd number of inverters, such that the output pulse has the desired width.

One-shot 100 functions as follows. As shown in FIG. 1A, initially signal IN is low and node A is high, therefore, output signal OUT is low. At time T0 input signal IN goes high. (In the present specification, the same reference characters are used to refer to terminals, signal lines, and their corresponding signals.) Both input signals to AND circuit 110 are now high, so output signal OUT goes high at time T1. The delay Td between times T0 and T1 is the delay through AND circuit 110.

Meanwhile, the high value on input terminal IN propagates through delay line 120, resulting in a low value at node A at time T2. The delay TdL between times T0 and T2 is the delay through delay line 120. The low value on node A results in a low value on output terminal OUT after an additional delay Td, at time T3.

Clearly, input signal IN cannot be allowed to go low again before node A goes low at time T2, or the width of the output high pulse will be reduced. In practice, because the delay of the delay line and the width of the output pulse can depend on factors such as temperature, operating voltage, and process variations, circuits are generally designed to wait until the one-shot output pulse is complete before returning the input signal to its initial value. In fact, typically a margin of error Tmargin is added after signal OUT goes low, before signal IN is allowed to return to a low value at time T4.

In response to the low value on signal IN, node A goes high again after another delay TdL, at time T5. Again, a margin of error Tmargin is typically added after node A goes high before signal IN is allowed to go high again. Thus, the minimum time period Tmin between high edges on input signal IN is Td+2(TdL+Tmargin).

FIG. 2 shows a well known one-shot low circuit 200 that provides a low pulse on an output terminal OUT in response to a falling edge on a signal on input terminal IN. The waveforms for circuit 200 are illustrated in FIG. 2A.

One-shot 200 includes a delay line 220, which comprises inverters 201–205 coupled in series, and OR circuit 210, which comprises NOR-gate 206 and inverter 207 also coupled in series. NOR-gate 206 is driven by input terminal IN and by input terminal IN delayed by delay line 220. Inverter 207 provides output signal OUT. Delay line 220 can include any odd number of inverters, such that the output pulse has the desired width.

One-shot 200 functions in a fashion similar to one-shot 100 of FIG. 1. As can be seen in FIG. 2A, a falling edge on input signal IN triggers a falling edge on output signal OUT, after a delay Td (the delay through OR circuit 210). However, the subsequent rising edge on output signal OUT is triggered by a rising edge on node B, after a delay Td+TdL, where TdL is the delay through delay line 220. Thus, the width of the low output pulse is determined by the delay through delay line 220, while the minimum time period between subsequent falling edges on input signal IN is again Td+2(TdL+Tmargin).

As described above, the conventional one-shots of FIGS. 1 and 2 are widely used in control circuits. However, they are generally not applied to speed-critical circuit paths, for several reasons. Firstly, the delay between the active edge on the input signal and the onset of the output pulse (Td) can also be undesirable. Secondly, the minimum time period between subsequent active edges on the input signal (Td+2(TdL+Tmargin)) is often too long for speed-critical paths. Last but not least, the circuits of. FIGS. 1 and 2 can be sensitive to process shifts. For example, a process corner that results in very fast inverters (i.e., a very short TdL) will result in a very short output pulse. In extreme cases, the output pulse width can be reduced to the point where it fails to do its job in properly controlling other circuits. At the opposite extreme, a very slow process corner can result in an extended output pulse that will adversely affect system performance.

Therefore, it is desirable to provide high-speed one-shot circuits, preferably having reduced susceptibility to process shifts. These high-speed one-shot circuits could potentially be used in applications in which one-shots have not previously been applied, for example in high-speed, heavily loaded driver circuits such as output driver circuits for ICs.

SUMMARY OF THE INVENTION

According to a first aspect of the invention, a one-shot circuit is provided that reacts quickly to changes to an input signal, thereby increasing the maximum supported frequency of the input signal.

According to one embodiment, a one-shot high generates a high output signal from an output circuit in response to a rising edge on the input signal, while the signal also travels through a delay chain towards the output circuit as in a conventional one-shot. When the delayed rising edge reaches the output circuit, the one-shot output signal goes low again. However, a falling edge on the input signal resets the one-shot without waiting for the signal to pass through the delay chain. Thus, another rising edge can be applied to the input terminal shortly after the previous falling edge.

In one embodiment, the delay chain is implemented using a chain of AND circuits, each driven by the preceding circuit in the chain and by the one-shot input signal.

According to another embodiment, a one-shot low generates a low output signal from an output circuit in response to a falling edge on the input signal, while the signal also travels through a delay chain towards the output circuit as in a conventional one-shot. When the delayed falling edge reaches the output circuit, the one-shot output signal goes high again. However, a rising edge on the input signal resets the one-shot without waiting for the signal to pass through the delay chain. Thus, another falling edge can be applied to the input terminal shortly after the previous rising edge.

In one such embodiment, the delay chain is implemented using a chain of OR circuits, each driven by the preceding circuit in the chain and by the one-shot input signal.

Some embodiments provide an additional speed advantage by implementing the output circuit as a pass gate coupled between the input terminal and the output terminal, and controlled by the output of the delay chain. A pulldown (for the one-shot high) or a pullup (for the one-shot low) is coupled to the output terminal and also controlled by the output of the delay chain, to provide an inactive value when the pulse is not being applied.

Other embodiments offer programmable capabilities. For example, some embodiments allow a user to correct for process shift by altering the effective delay of the delay chain. According to one such embodiment, a multiplexer is provided that selects one of two or more points in the delay chain, and passes the selected signal to the last delay element in the delay chain. In other embodiments, the multiplexer is inserted at other points in the delay chain, e.g., earlier in the delay chain or at the end of the delay chain.

Other programmable options can include providing a tristateable output signal, tying the output terminal to power high or ground, programming the one-shot to act as a simple delay chain, or simply bypassing the one-shot circuit to pass the input signal to the output terminal.

According to a second aspect of the invention, a driver circuit is provided that can drive heavily loaded signals at high speeds with a reduced crowbar current. In a conventional driver circuit, the output pullup and pulldown are typically turned on simultaneously for a significant period of time when the output signal changes state. Thus, current flows between ground and power high. This current is referred to herein as a crowbar current. The crowbar current increases the power consumption of the circuit. The contention between the pullup and pulldown also increases the time required for the circuit output to change state. In the driver circuit of the invention, one-shots are used to drive the pullup and pulldown, thereby minimizing the period when pullup and pulldown are both turned on. One-shots according to the first aspect of the invention are preferably used.

One such embodiment includes an inverter, a one-shot low circuit, a one-shot high circuit, a pullup, and a pulldown. The inverter is driven by a driver input signal and has an output terminal coupled to the driver output terminal. The pullup and pulldown are coupled to the driver output terminal. The one-shot low circuit is driven by the driver input signal and controls the pullup, which in one embodiment is a P-channel transistor. The one-shot high circuit is driven by the driver input signal and controls the pulldown, which in one embodiment is an N-channel transistor.

According to another embodiment, a driver circuit includes two pre-driver circuits, one controlling an output pullup and the other controlling an output pulldown. Each of the pre-driver circuits is implemented using a one-shot low and a one-shot high, as described above. This driver circuit can be made sufficiently powerful to act as an output driver circuit for an IC. In one embodiment, the IC is a programmable logic device (PLD), and programmable capabilities such as those described above are provided.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
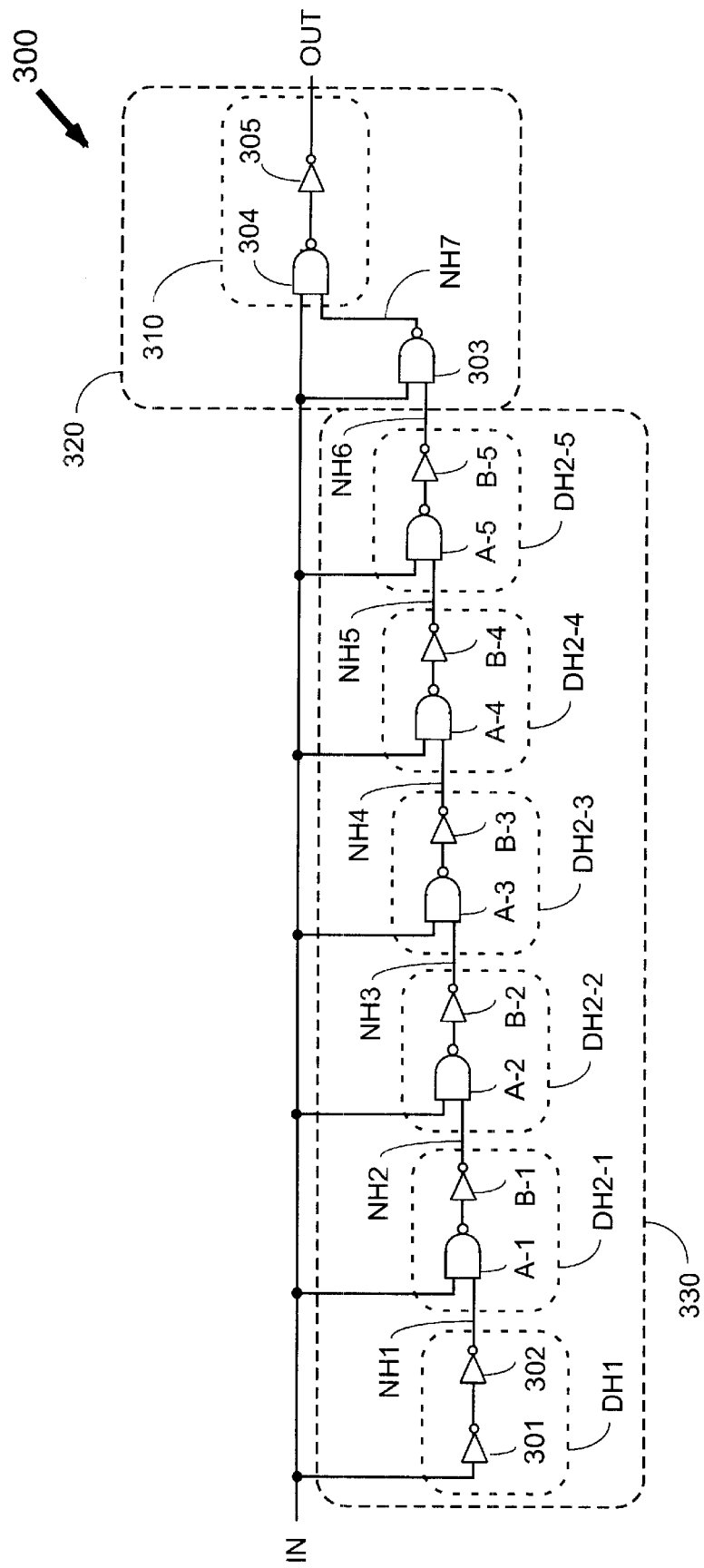
FIG. 3 shows a first one-shot high according to an embodiment of the invention.

FIG. 3 shows a first one-shot high 300 according to one embodiment of the invention. One-shot high 300 includes a delay chain 330 and an output circuit 320. Output circuit 320 includes a NAND gate 303, driven by delay chain 330 and by input terminal IN, and an AND circuit 310, driven by NAND gate 303 and input terminal IN. AND circuit 310 includes NAND gate 304 followed by inverter 305, which provides one-shot output signal OUT.

Delay chain 330 includes a first delay element DH1 followed by five delay elements (AND circuits) DH2-1 to DH2-5. Delay element DH1 includes two inverters 301, 302 coupled in series, with the input terminal of inverter 301 coupled to input terminal IN, and the output terminal of inverter 302 coupled to an input terminal of AND circuit DH2-1. Each AND circuit DH2-x includes a NAND gate A-x driven by the output NHx of the previous delay element and by input terminal IN, and driving an associated inverter B-x. Each inverter B-x provides the output signal (NH(x+1)) that drives the next delay element (DH2-(x+1)). Inverter B-5 drives NAND gate 303 in output circuit 320.

Figure 3A:
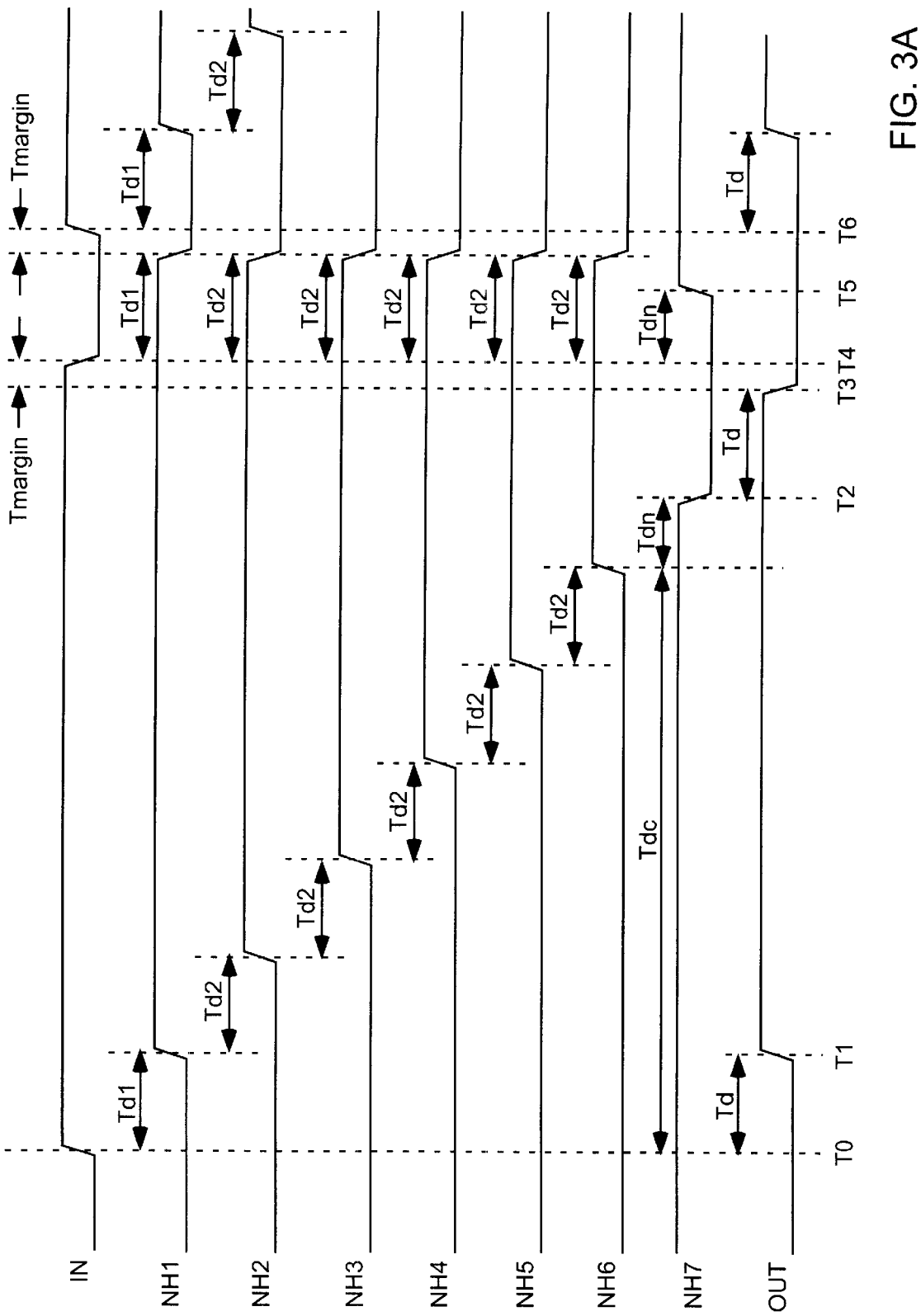
FIG. 3A shows the waveforms associated with the one-shot high of FIG. 3.

One-shot 300 functions as follows. As shown in FIG. 3A, initially signal IN is low. Therefore, nodes NH1–NH6 are also low, node NH7 is high, and output signal OUT is low. At time T0, input signal IN goes high. Both signals driving AND circuit 310 are now high, so output signal OUT goes high at time T1. The delay Td between times T0 and T1 is the delay through AND circuit 310.

Meanwhile, the high value on input terminal IN propagates through the delay chain, resulting in successive high values at nodes NH1, NH2, . . . , NH6. The delay Td1 shown in FIG. 3A is the delay through delay element DH1. The delay Td2 is the delay through one of AND circuits DH2-1 to DH2-5. The delay Tdc is the delay through the entire delay chain, from input signal IN to node NH6.

At time T2, the high value at node NH6 combined with the high value of input signal IN results in a low value at node NH7. The delay Tdn is the delay through NAND gate 303. The low value on node NH7 results in a low value on output terminal OUT after an additional delay Td, at time T3.

Figure 1:
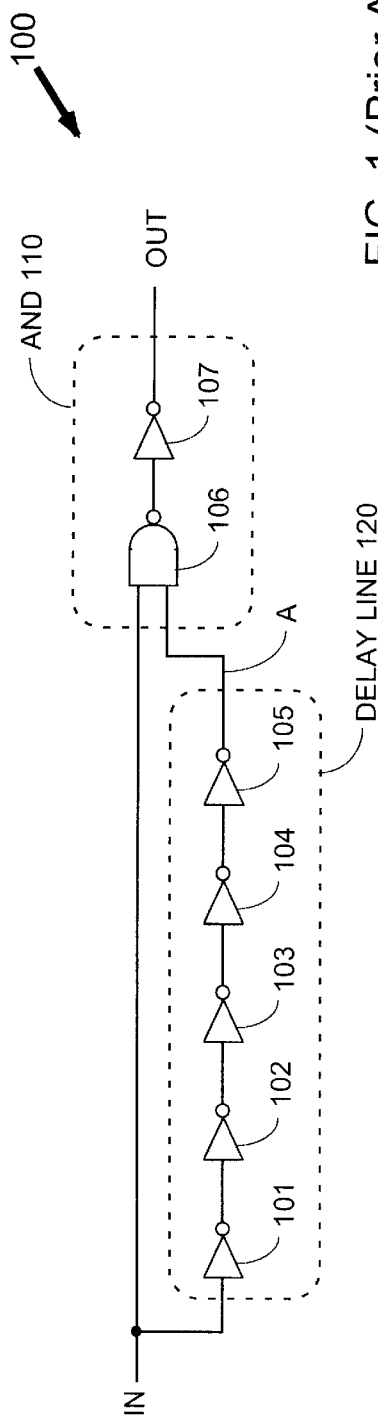
FIG. 1 shows a prior art one-shot high.
Figure 1A:
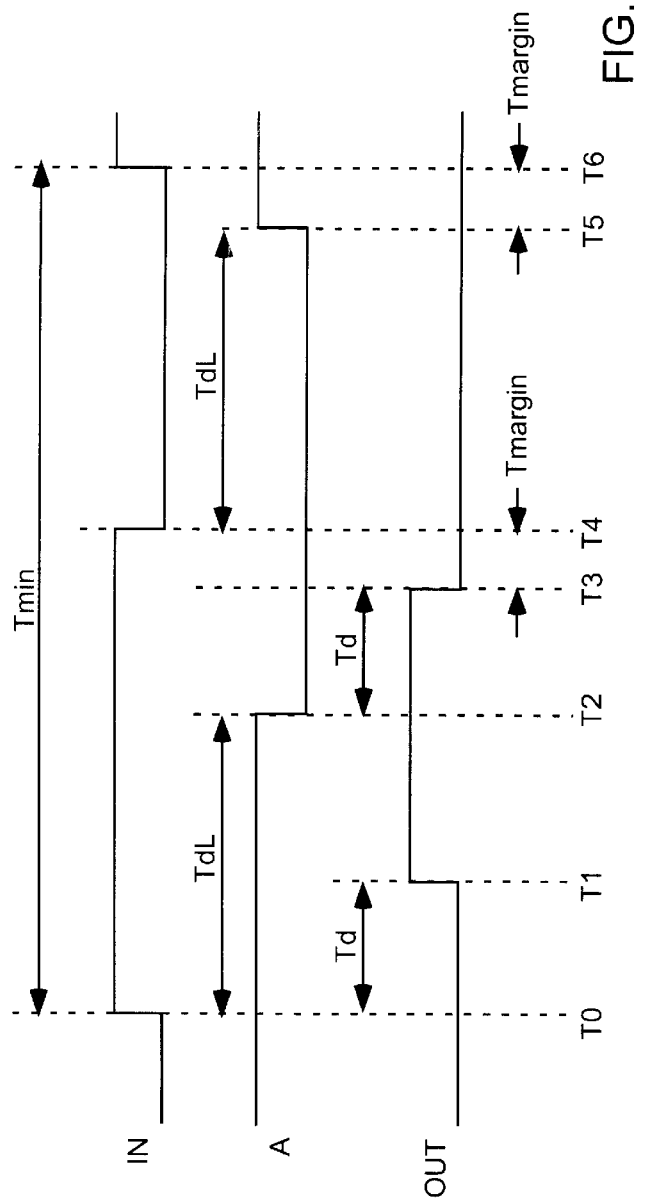
FIG. 1A shows the waveforms associated with the one-shot high of FIG. 1.
Figure 2:
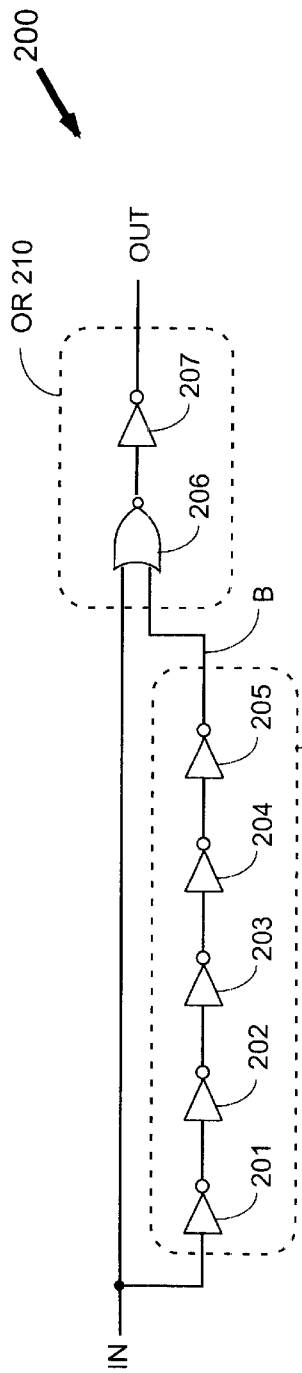
FIG. 2 shows a prior art one-shot low.
Figure 2A:
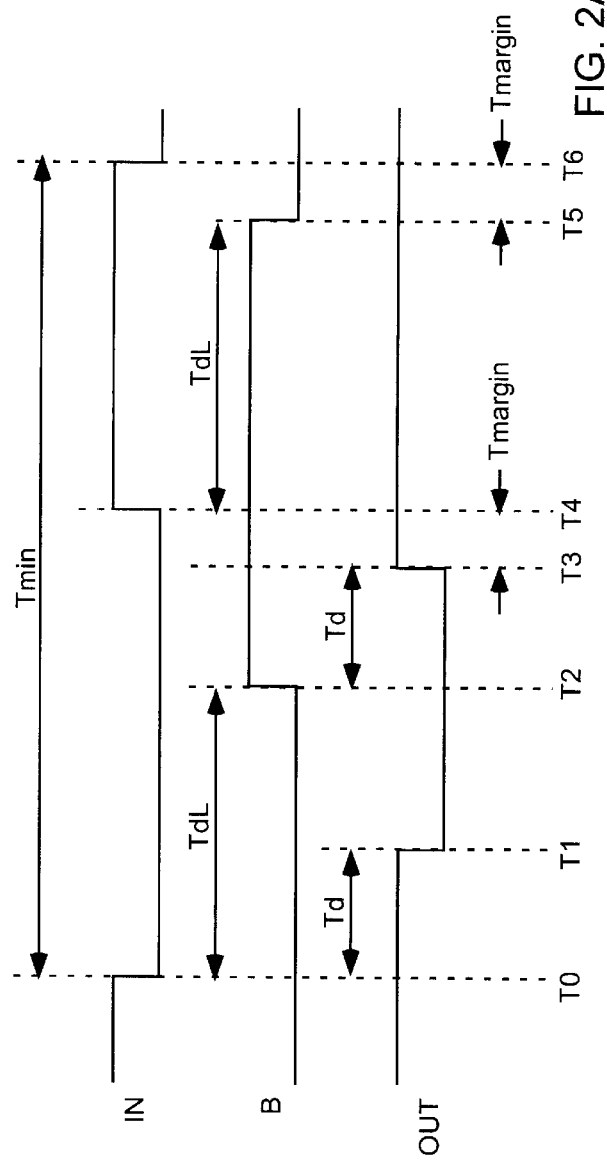
FIG. 2A shows the waveforms associated with the one-shot low of FIG. 2.

As in the prior art circuit of FIG. 1, circuits providing input signal IN are preferably designed to wait until the one-shot output pulse is complete before returning the input signal to its initial value. In one embodiment, a margin of error Tmargin is added after signal OUT goes low before signal IN is allowed to return to a low value at time T4.

At time T5, in response to the low value on signal IN, node NH7 goes high again after another delay Tdn. Node NH1 goes low a delay Td1 after input signal IN goes low. Nodes NH2–NH6 also go low a delay Td2 after input signal IN goes low. A margin of error Tmargin is preferably added after the last of these nodes goes low before signal IN is allowed to go high again. In one embodiment, delays Td1 and Td2 are about the same, so nodes NH1–NH6 all go low at about the same time.

Note that for one-shot 300 of FIG. 3, the minimum time period between high edges on input signal IN is Tdc+Tdn+Td+(the largest of Td1, Td2, and Tdn)+2Tmargin. In one embodiment, each delay element has about the same delay, which we will call Tave. Thus, Td=Td1=Td2=Tdn=Tave. (In some embodiments, these values are all different from each other.) In this embodiment, the minimum time period between high edges on input signal IN is Tdc+3Tave+2Tmargin. Notice that the delay of the daisy chain appears only once in this result.

For purposes of comparison, consider the case where a similar restriction (i.e., equal delays for each delay element and logic gate) is applied to the prior art one-shot of FIG. 1. It is clear that for the prior art one-shot of FIG. 1, the minimum time period Tmin between high edges on input signal IN is Tave+2TdL+2Tmargin, where TdL is the delay of the delay line. Clearly, where delay lines having the same delay are used in the two one-shots, and where the delay lines include more than two delay elements, one-shot 300 has a higher switching frequency than the prior art one-shot of FIG. 1. The higher switching frequency is made possible by the use of input signal IN as an input to delay elements DH2-1 to DH2-5 and NAND gate 303 of FIG. 3.

Figure 4:
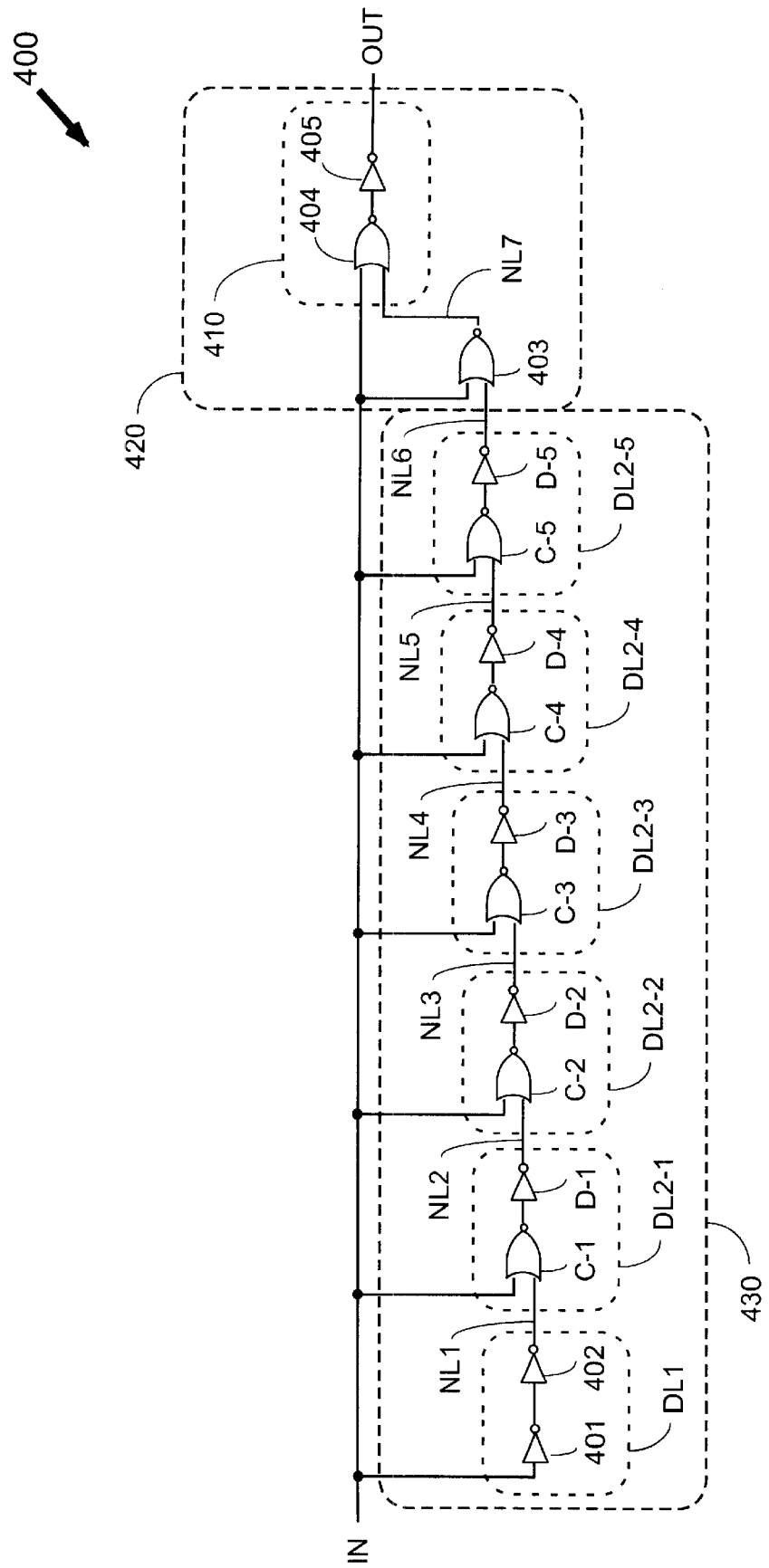
FIG. 4 shows a first one-shot low according to an embodiment of the invention.

FIG. 4 shows a first one-shot low 400 according to one embodiment of the invention. One-shot low 400 is similar to one-shot high 300 of FIG. 3, except that an OR circuit 410 including NOR gate 404 and inverter 405 is substituted for AND circuit 310, NOR gate 403 is substituted for NAND gate. 303, and each of delay elements DL2-1 to DL2-5 is an OR circuit instead of an AND circuit.

Figure 4A:
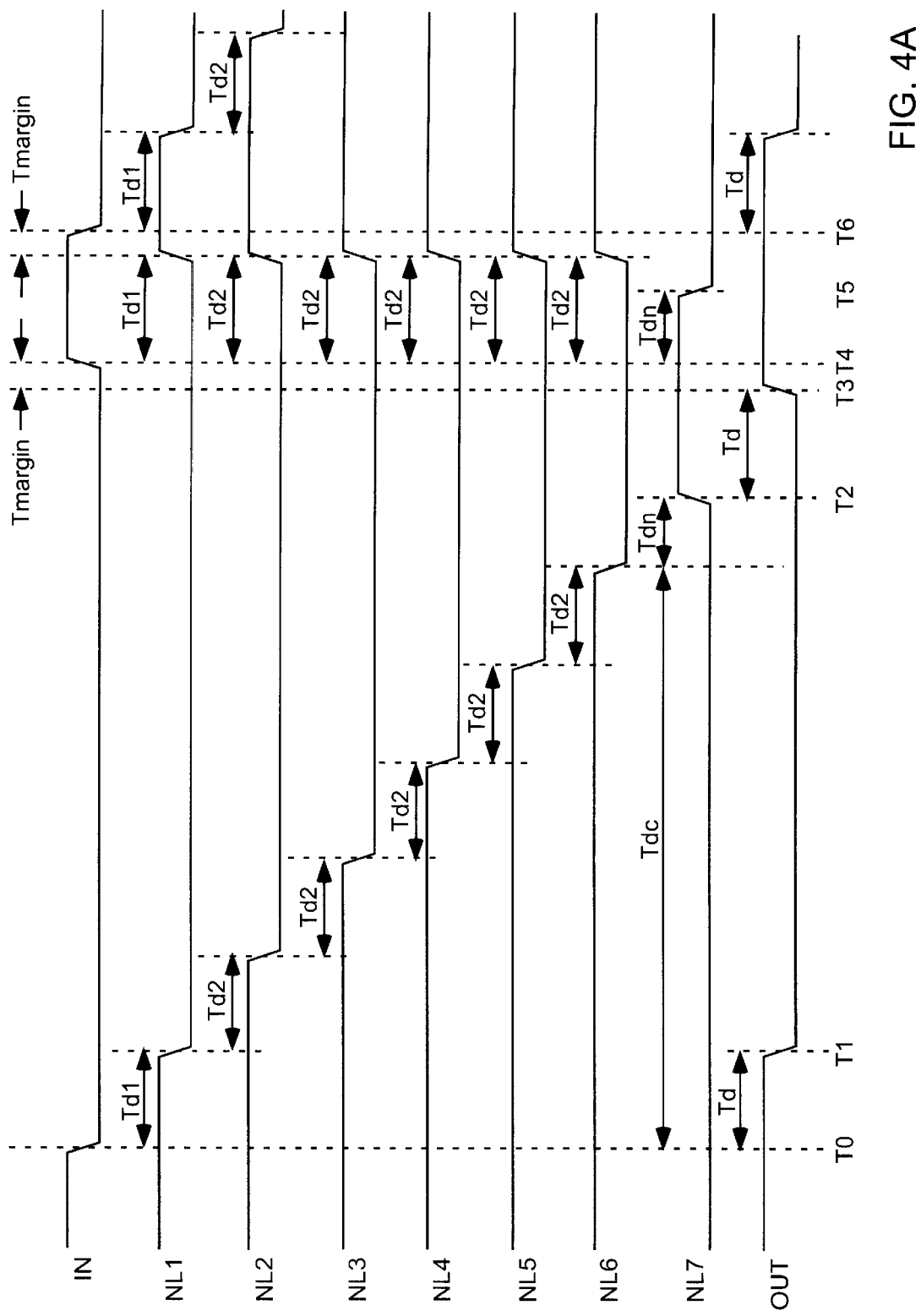
FIG. 4A shows the waveforms associated with the one-shot low of FIG. 4.

One-shot low circuit 400 provides a low output pulse in response to a falling edge on input signal IN, as shown in FIG. 4A. As can be seen from the waveforms of FIG. 4A, the timing of one-shot low circuit 400 is similar to the timing of one-shot high circuit 300, shown in FIG. 3A and described in connection with that figure.

Figure 5:
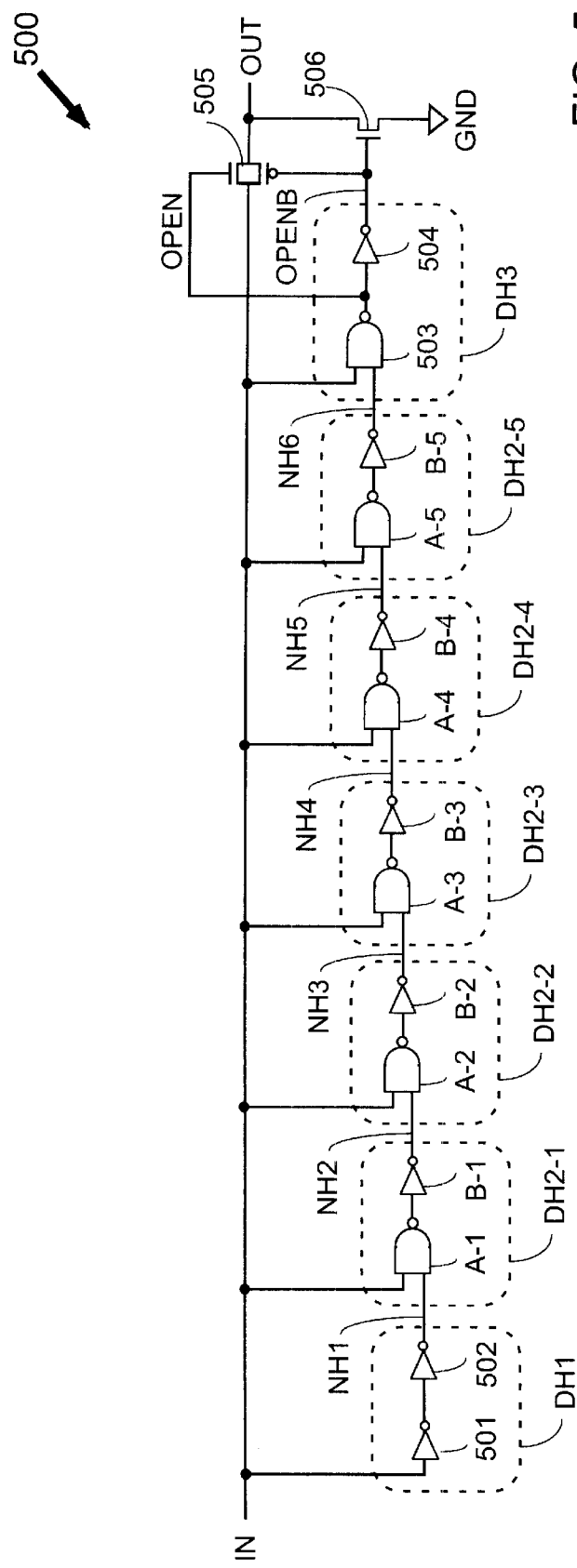
FIG. 5 shows a second one-shot high according to an embodiment of the invention.

FIG. 5 shows another embodiment of the invention having a different output circuit. One-shot 500 of FIG. 5 is a one-shot high that offers the higher switching frequency of one-shot 300 (FIG. 3), and also has a shorter response time to a rising edge on input signal IN.

One-shot high 500 has an output circuit that includes a pass gate 505 (in the pictured embodiment a CMOS pass gate) coupled between input terminal IN and output terminal OUT. Also coupled to output terminal OUT is a pulldown 506, implemented in the pictured embodiment as an N-channel transistor coupled between the output terminal and ground. A final AND circuit DH3 is added to the delay chain, and provides both NAND 503 and inverter 504 output signals (signals OPEN and OPENB, respectively). Signal OPEN is coupled to the N-gate terminal of CMOS pass gate 505, while signal OPENB is coupled to the P-gate terminal of CMOS pass gate 505 and to the gate terminal of pulldown 506.

Figure 5A:
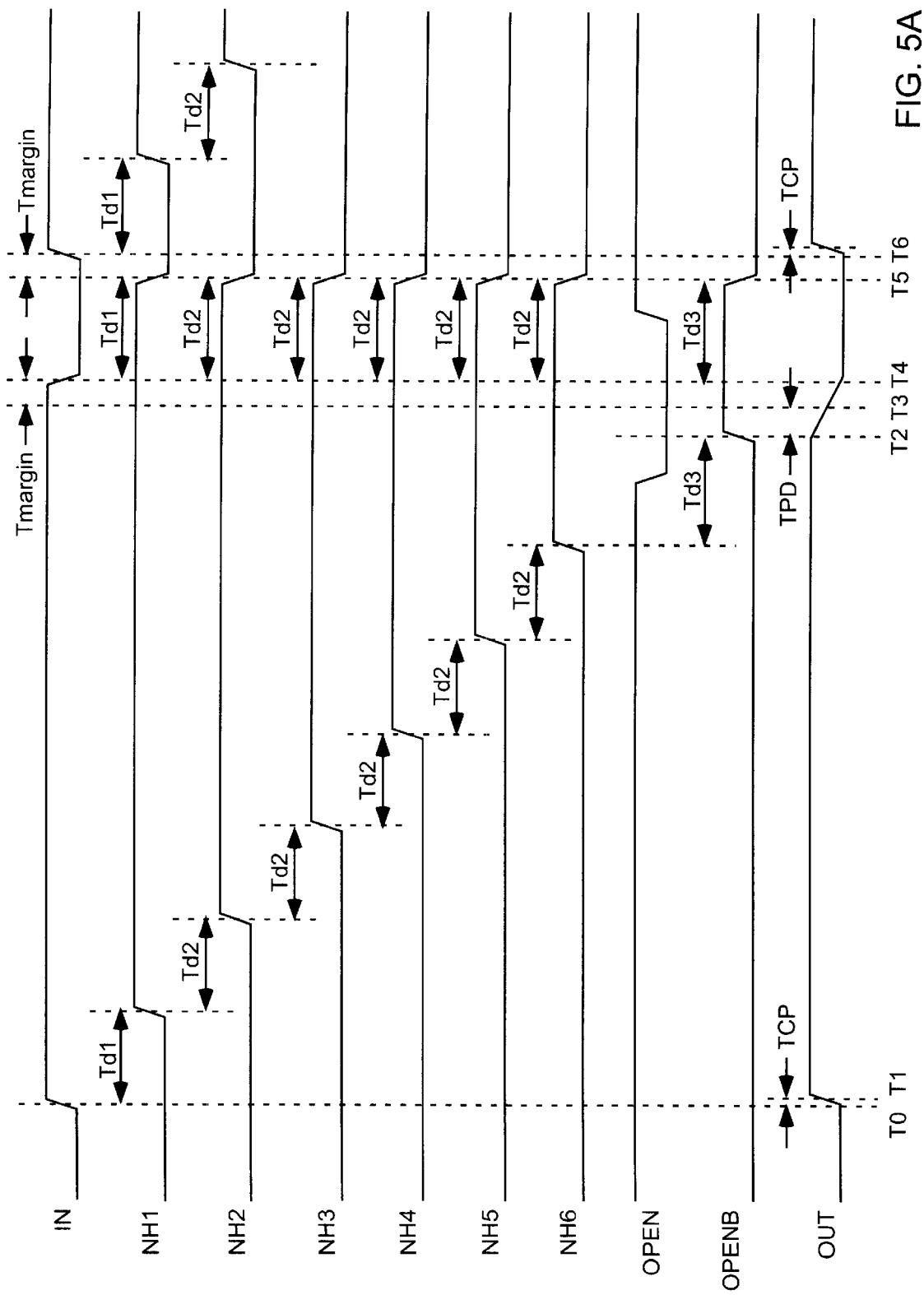
FIG. 5A shows the waveforms associated with the one-shot high of FIG. 5.

One-shot 500 functions as follows. As shown in FIG. 5A, initially signal IN is low. Therefore, nodes NH1–NH6 are also low, node OPEN is high, and node OPENB is low. Therefore, pass gate 505 is turned on and output signal OUT follows input signal IN. Therefore, output signal OUT is low.

At time T0, input signal IN goes high. Because pass gate 505 is turned on, output signal OUT goes high at time T1. The delay TCP between times T0 and T1 is just the delay through pass gate 505, which is relatively short compared to the delay through AND circuit 310 in FIG. 3.

Meanwhile, as in the embodiment of FIG. 3, the high value on input terminal IN propagates through the delay chain, resulting in successive high values at nodes NH1, NH2, . . . , NH6. The delay Td1 shown in FIG. 5A is the delay through delay element DH1. The delay Td2 is the delay through one of AND circuits DH2-1 to DH2-5.

At time T2, the high value at node NH6 combined with the high value of input signal IN results in a high value at node OPENB. The delay Td3 is the delay through AND circuit DH3. Node OPEN is low. The high value on node OPENB combined with the low value on node OPEN ensures that pass gate 505 is turned off. However, pulldown 506 is enabled by the high value on node OPENB, resulting in a low value on output terminal OUT at time T3. The delay TPD indicated in FIG. 5A is the time required to pull output signal OUT low through pulldown 506.

Note that in the pictured embodiment, TPD (the time required for output signal OUT to fall to a value of VDD/2 through pulldown 506) is longer than TCP (the rise time of output signal OUT to a value of VDD/2 through pass gate 505). One-shot circuit 500 can be designed with a larger pulldown 506 to decrease the output fall time, or with a smaller pulldown 506 to reduce the current flow as output signal OUT goes low.

As in the embodiment of FIG. 3, circuits providing input signal IN are preferably designed to wait until the one-shot output pulse is complete before returning the input signal to its initial value. Therefore, a margin of error Tmargin is added after signal OUT goes low, before signal IN is allowed to return to a low value at time T4.

At time T5, in response to the low value on signal IN, node OPENB goes low again after another delay Td3. Node NH1 goes low a delay Td1 after input signal IN goes low. Nodes NH2–NH6 also go low a delay Td2 after input signal IN goes low. A margin of error Tmargin is preferably added after the last of these nodes goes low before signal IN is allowed to go high again. In one embodiment, delays Td1, Td2, and Td3 are about the same, so nodes NH1–NH6 and OPENB all go low at about the same time.

Figure 6:
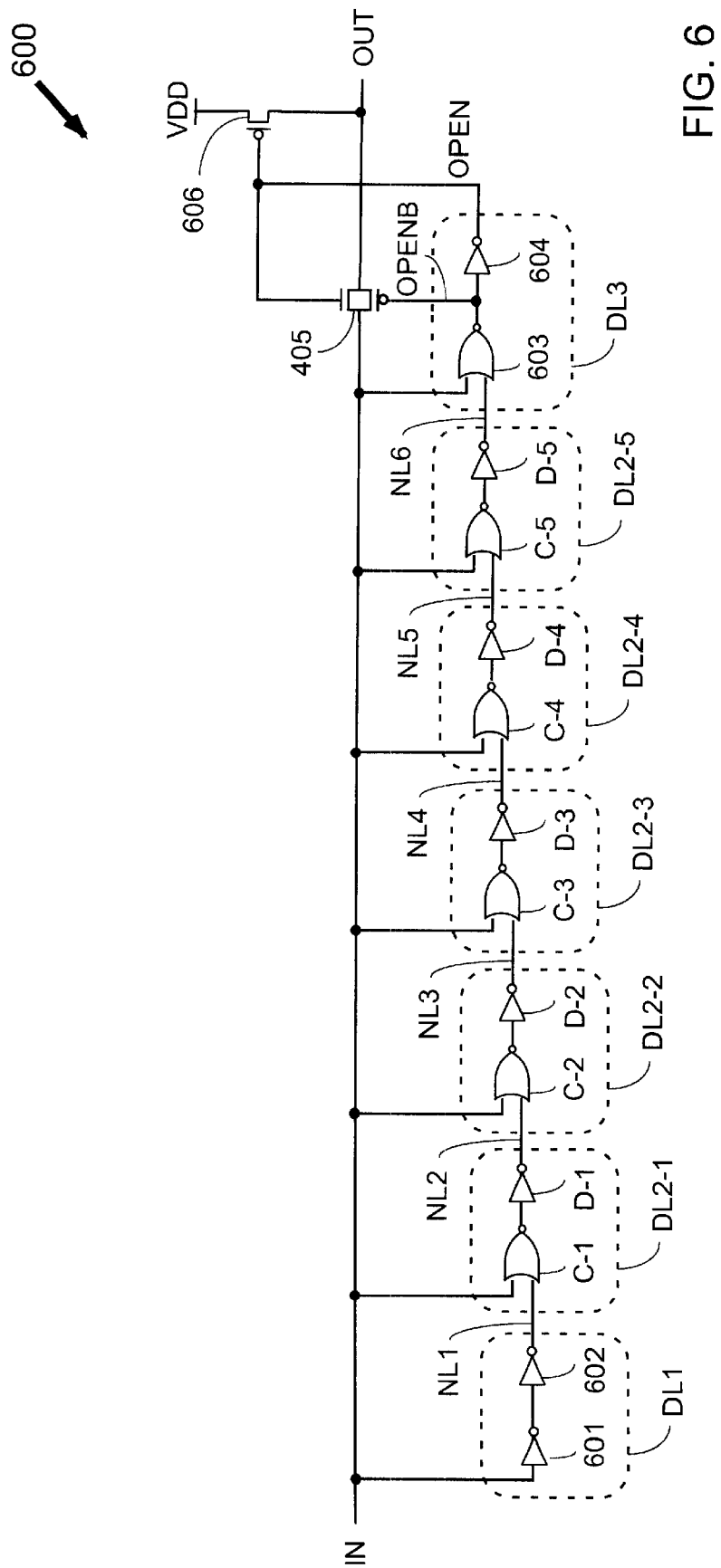
FIG. 6 shows a second one-shot low according to an embodiment of the invention.

FIG. 6 shows a second one-shot low 600 according to one embodiment of the invention. One-shot low 600 is similar to one-shot high 500 of FIG. 5, except that each of delay elements DL2-1 to DL2-5 and DL3 is an OR circuit instead of an AND circuit, signal OPENB is the NOR output and signal OPEN is the inverter output of OR circuit DL3, and pulldown 506 is replaced by pullup 606 gated by signal OPEN.

Figure 6A:
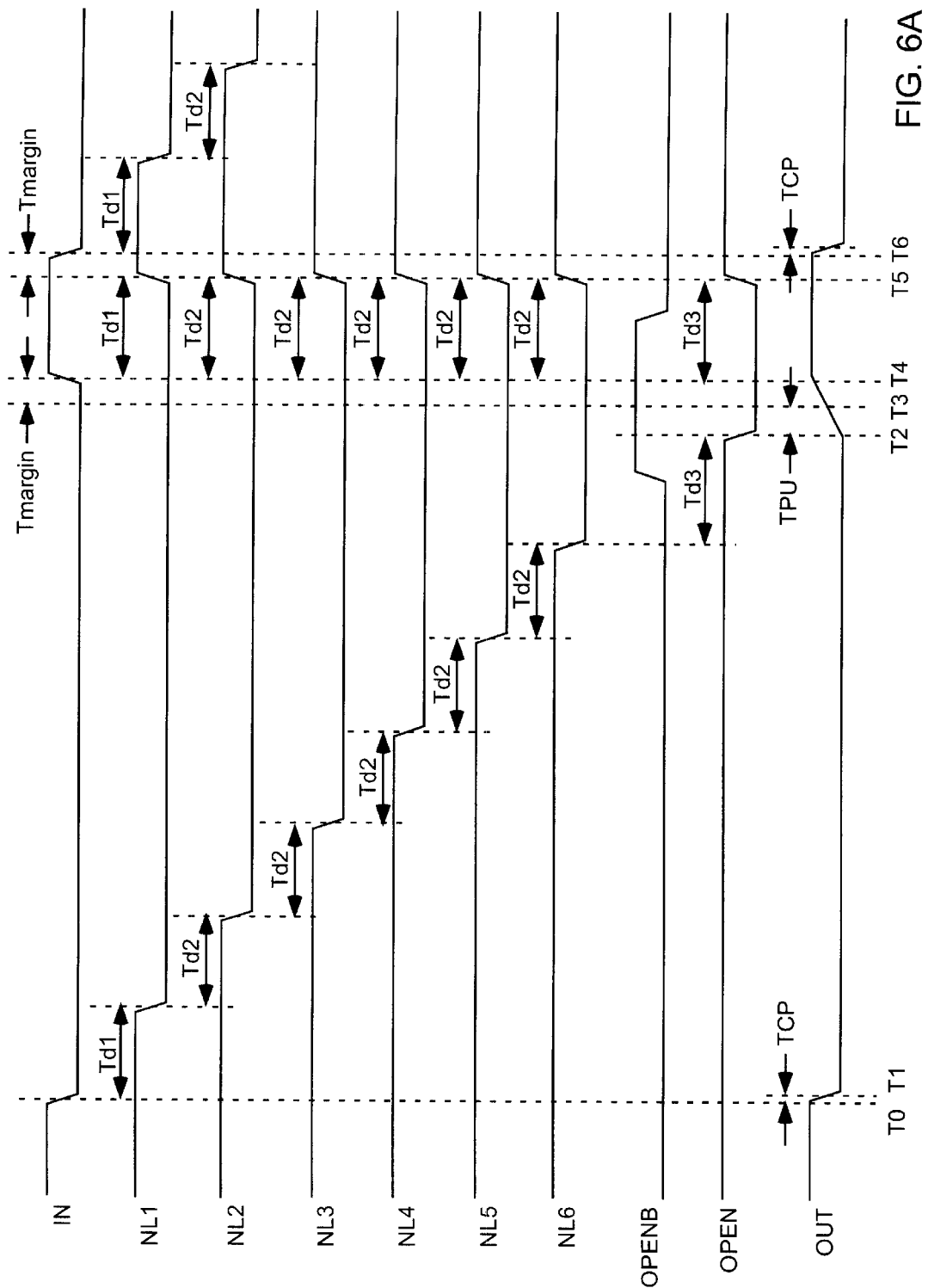
FIG. 6A shows the waveforms associated with the one-shot low of FIG. 6.

One-shot low circuit 600 provides a low output pulse in response to a falling edge on input signal IN, as shown in FIG. 6A. As can be seen from the waveforms of FIG. 6A, the timing of one-shot low circuit 600 is similar to the timing of one-shot high circuit 500, shown in FIG. 5A and described in connection with that figure.

Figure 7:
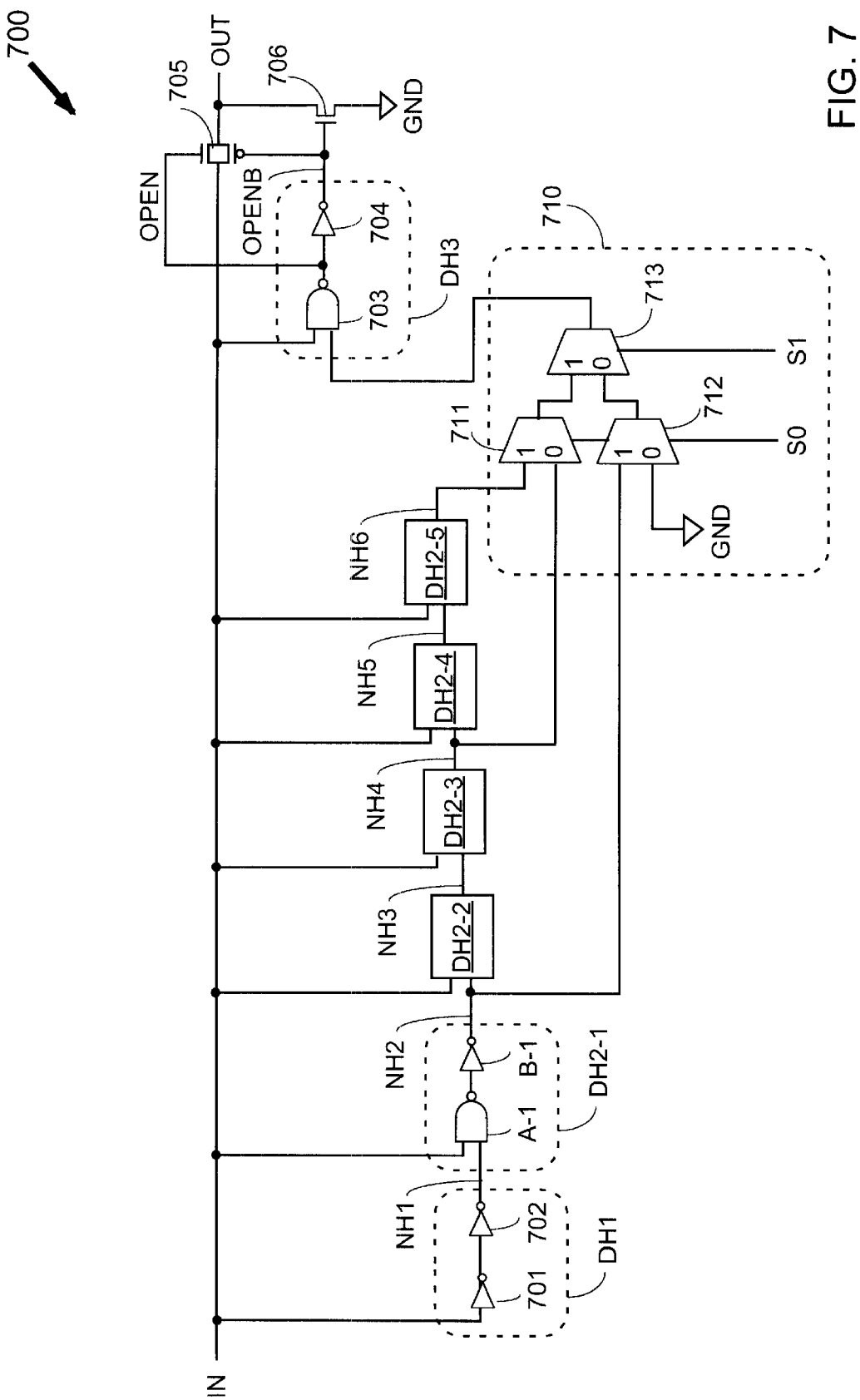
FIG. 7 shows a first programmable one-shot high according to an embodiment of the invention.

Prior art one-shot circuits are generally susceptible to process shifts, as described above in the background section. The one-shot high shown in FIG. 7 provides a means for correcting for process shifts by programmably selecting the number of delay elements included in the delay chain.

For example, an IC can be designed to select by default a point about midway through the delay chain, and to use this signal as the output signal from the delay chain. On testing the IC, if the pulse on the OUT signal is found to be too short to accomplish its purpose, additional delay can be added by increasing the number of elements included in the delay chain. If the pulse on the OUT signal is longer than is desirable, the switching frequency of the one-shot can be increased by reducing the number of elements included in the delay chain.

One application in which a programmable one-shot is particularly useful is in a programmable logic device (PLD). (The term "PLD" as used herein includes but is not limited to Field Programmable Gate Arrays (FPGAs), mask programmable devices such as Application Specific ICs (ASICs), Complex Programmable Logic Devices (CPLDs), and devices in which only a portion of the logic is programmable.) For example, an FPGA or a CPLD is typically programmed using a large number of data bits. Values for the various select signals of a one-shot circuit can easily be stored in configuration memory cells and configured along with the many other configuration memory cells in the device.

One-shot 700 is similar to one-shot 500 of FIG. 5 except for the programmability of the delay chain. The delay chain in the one-shot high of FIG. 7 includes a multiplexer circuit 710 between two of the elements in the delay chain, in the pictured embodiment between delay elements DH2-5 and DH3. In other embodiments, multiplexer circuits can be added at other points in the delay chain instead of or in addition to multiplexer circuit 710.

Multiplexer circuit 710 allows a user to programmably select any of nodes NH2, NH4, and NH6 to drive delay element DH3. In addition, one programmable option allows the user to pass the ground signal GND to delay element DH3. When ground GND is selected to drive delay element DH3, signal OPEN is high and signal OPENB is low, therefore, input signal IN is passed to the output terminal OUT. Pulldown 706 on output terminal OUT is turned off by the low value on node OPENB. The one-shot is effectively bypassed.

Table 1 shows the select signal values and the resulting functions of the one-shot. In Table 1, Tcp is the delay of a CMOS pass gate, Td1 is the delay of delay element DH1, Td2 is the delay of delay elements DH2-x, Tm is the delay of multiplexer circuit 710, and Td3 is the delay of delay element DH3.

TABLE 1

| S1 | S0 | Function | Pulse Width |
| --- | --- | --- | --- |
| 0 | 0 | Bypass One-shot | None (OUT = IN delayed by Tcp) |
| 0 | 1 | One-shot high | Td1 + Td2 + Tm + Td3 |
| 1 | 0 | One-shot high | Td1 + 3Td2 + Tm + Td3 |
| 1 | 1 | One-shot high | Td1 + 5Td2 + Tm + Td3 |

Figure 8:
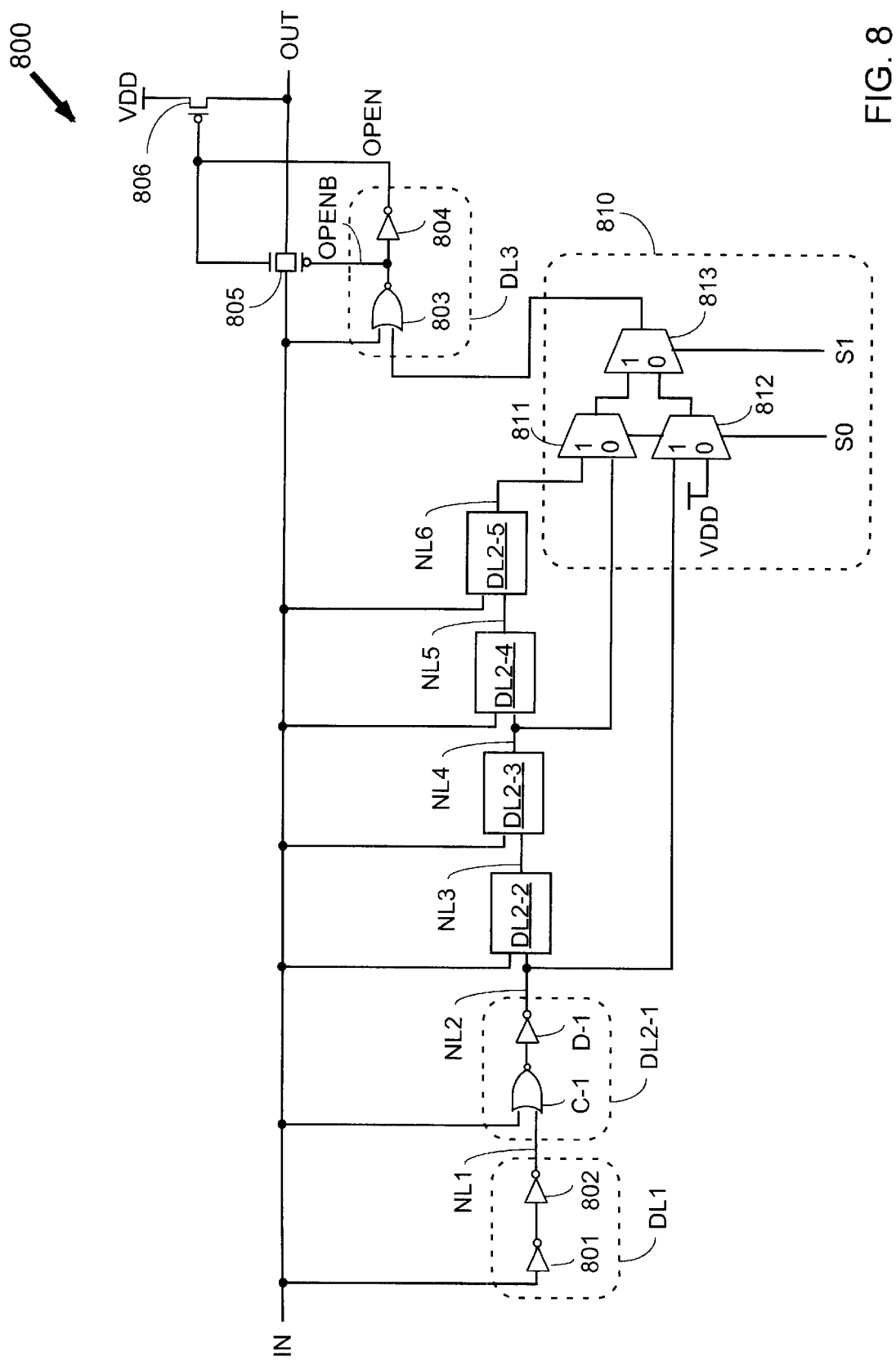
FIG. 8 shows a first programmable one-shot low according to an embodiment of the invention.

FIG. 8 shows a one-shot low 800 with a programmable delay chain according to one embodiment of the invention. One-shot low 800 is similar to one-shot high 700 of FIG. 7, except that each of delay elements DL2-1 to DL2-5 and DL3 is an OR circuit instead of an AND circuit, signal OPENB is the NOR output and signal OPEN is the inverter output of OR circuit DL3, and pulldown 706 is replaced by pullup 806 gated by signal OPEN.

Additionally, multiplexer 810 is similar to multiplexer 710 of FIG. 7, except that when both select signals S0, S1 are low, a power high value VDD is passed through multiplexer 810. Therefore, signal OPENB is low and signal OPEN is high, and input signal IN is passed to the output terminal OUT. Pullup 806 on output terminal OUT is turned off by the high value on node OPEN. The one-shot is effectively bypassed.

Figure 9:
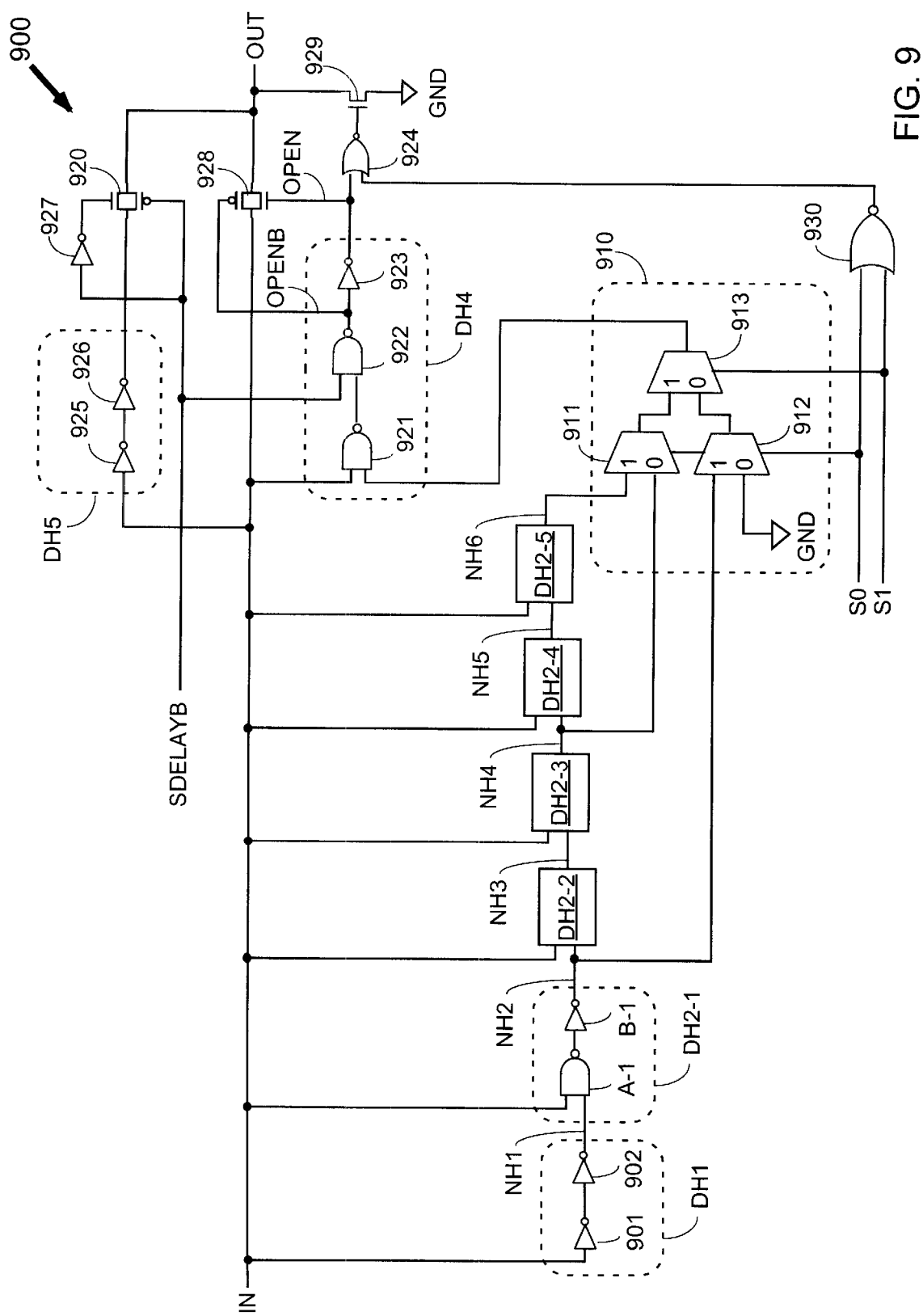
FIG. 9 shows a second programmable one-shot high according to an embodiment of the invention.

FIG. 9 shows a one-shot high that includes yet another programmable option, which allows the user to configure the one-shot as a simple delay line. When signal SDELAYB goes low, a path is enabled that flows from input terminal IN, through delay line DH5 and pass gate 920, to output terminal OUT. When signal SDELAYB goes low, the path through pass gate 928 is also turned off, by forcing signal OPENB high and signal OPEN low through newly added NAND gate 922. Other newly added elements are NOR gates 930 and 924, which together ensure that when both of select signals S0 and S1 are low, pulldown 929 is disabled. Thus, whenever signal SDELAYB is low, signals S0 and S1 must also be low, to avoid contention at output terminal OUT.

In the pictured embodiment, delay line DH5 includes two inverters 925, 926 coupled in series. However, any type of delay line can be used, including, for example, delay lines formed using a larger number of inverters coupled in series.

Table 2 shows the various programmable options available in the embodiment of FIG. 9. In Table 2, Tcp is the delay of a CMOS pass gate, Td1 is the delay of delay element DH1, Td2 is the delay of delay elements DH2-x, Tm is the delay of multiplexer circuit 910, Td4 is the delay of delay element DH4, and Td5 is the delay of delay line DH5.

TABLE 2

| SDELAYB | S1 | S0 | Function | Pulse Width |
|---|---|---|---|---|
| 0 | 0 | 0 | Delay Line | None (OUT = IN delayed by Td5 + Tcp) |
| 0 | 0 | 1 | Not supported | |
| 0 | 1 | 0 | Not supported | |
| 0 | 1 | 1 | Not supported | |
| 1 | 0 | 0 | Bypass One-shot | None (OUT = IN delayed by Tcp) |
| 1 | 0 | 1 | One-shot | Td1 + Td2 + Tm + Td4 |
| 1 | 1 | 0 | One-shot | Td1 + 3Td2 + Tm + Td4 |
| 1 | 1 | 1 | One-shot | Td1 + 5Td2 + Tm + Td4 |

Figure 10:
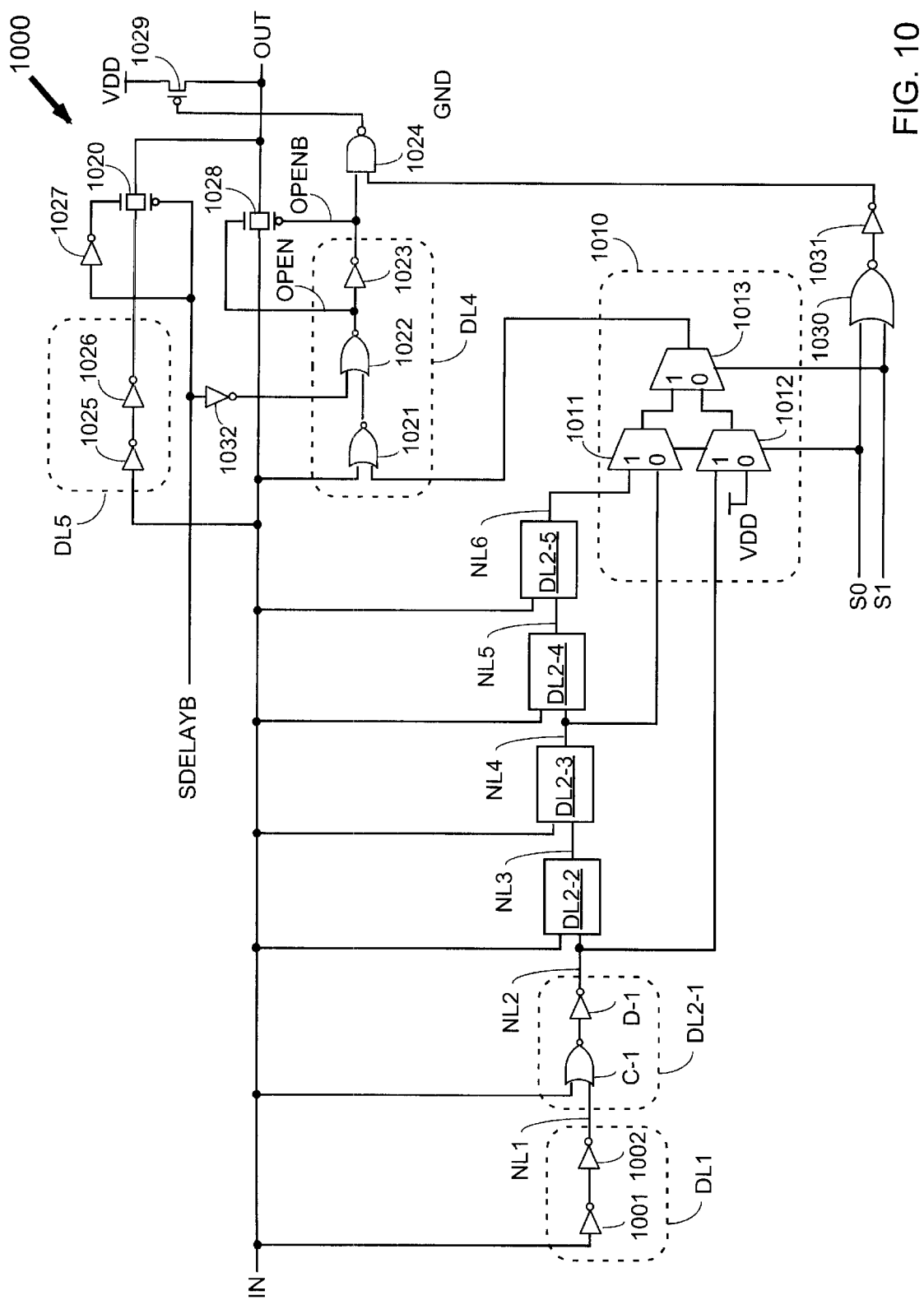
FIG. 10 shows a second programmable one-shot low according to an embodiment of the invention.

FIG. 10 shows a one-shot low 1000 that offers the same programmable features as one-shot high 900 of FIG. 9. Therefore, one-shot low 1000 is similar to one-shot high 900 of FIG. 9, and Table 2 applies equally well to one-shot 1000.

However, each of delay elements DL2-1 to DL2-5 is an OR circuit instead of an AND circuit, NAND gates 921 and 922 are replaced with NOR gates 1021 and 1022, respectively, and NOR gate 924 is replaced with NAND gate 1024. Signal OPEN is the output of NOR gate 1022 and signal OPENB is the output of inverter 1023. Pulldown 929 is replaced by pullup 1029 gated by the output of NAND gate 1024. Inverter 1031 is inserted after NOR gate 1030, and inverter 1032 is inserted between the SDELAYB terminal and NOR gate 1022. Multiplexer 1012 passes a power high value VDD when select signals S0 and S1 are both low.

When signal SDELAYB goes low, a path is enabled that flows from input terminal IN, through delay line DL5 and pass gate 1020, to output terminal OUT. When signal SDELAYB goes low, the path through pass gate 1028 is also turned off, by forcing signal OPEN low and signal OPENB high through inverter 1032 and NOR gate 1022. NOR gate 1030, inverter 1031, and NAND gate 1024 together ensure that when both of select signals S0 and S1 are low, pullup 1029 is disabled. Thus, whenever signal SDELAYB is low, signals S0 and S1 must also be low, to avoid contention at output terminal OUT (see Table 2).

In the pictured embodiment, delay line DL5 includes two inverters 1025, 1026 coupled in series. However, any type of delay line can be used, including, for example, delay lines formed using a larger number of inverters coupled in series.

As previously described, the invention provides several one-shot circuits, both one-shot highs and one-shot lows, having a high switching frequency and a fast response time. These one-shot circuits can be used in various applications in electronic systems. They are particularly advantageous when used in the speed paths of these systems. For example, the one-shot circuits of the invention can be used to implement high-speed driver circuits capable of driving heavy loads but having a low crowbar current, as will now be described.

Figure 11:
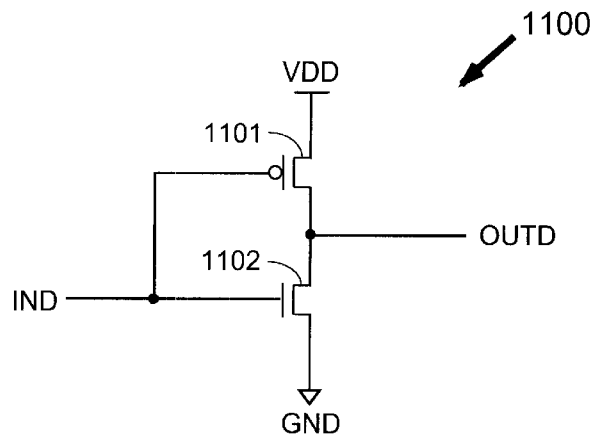
FIG. 11 shows a first prior art driver circuit.

FIG. 11 shows a first prior art driver circuit 1100, which is just a CMOS inverter. Pullup 1101 and pulldown 1102 are coupled in series between power high VDD and ground GND. Pullup 1101 and pulldown 1102 are both controlled by input signal IND. The node between pullup 1101 and pulldown 1102 is coupled to output terminal OUTD.

Figure 11A:
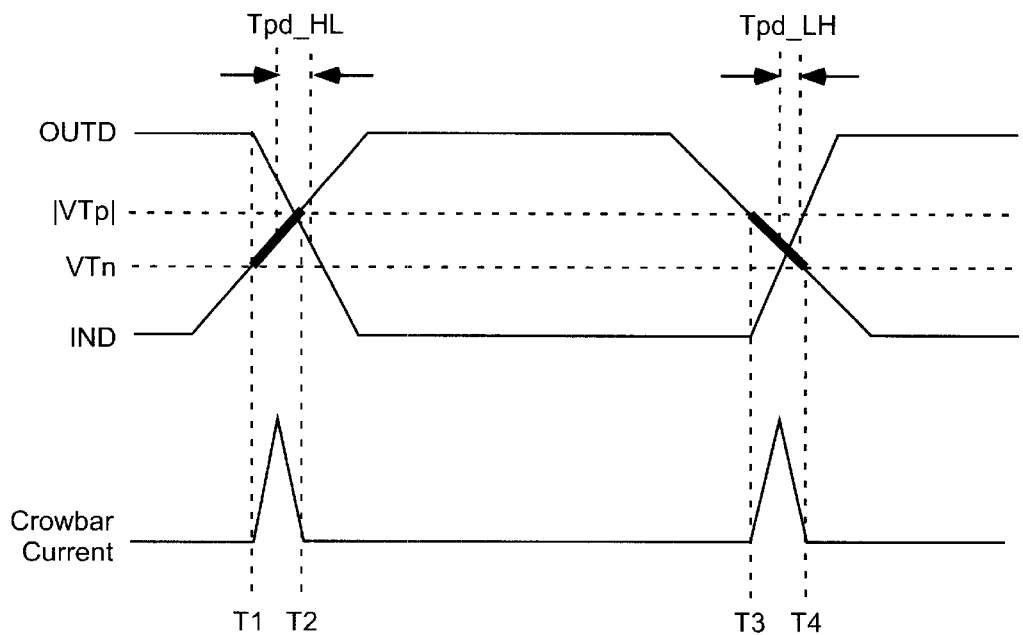
FIG. 11A shows the waveforms associated with the driver circuit of FIG. 11.

FIG. 11A illustrates the waveforms associated with driver circuit 1100 of FIG. 11. Initially, input signal IND is low, enabling pullup 1101 and disabling pulldown 1102. Therefore, output signal OUTD is high. Input signal IND then begins to rise, and at time T1 reaches the threshold voltage VTn of an N-channel transistor. Pulldown 1102 turns on, but pullup 1101 is also still on. Therefore, a crowbar current passes from ground GND to power high VDD through pulldown 1102 and pullup 1101, as shown in the lower part of FIG. 11A.

As the voltage level of input signal IND rises, the voltage level of output signal OUTD begins to fall. At time T2, the voltage on signal IND rises above the absolute value of the threshold voltage |VTp| of a P-channel transistor. Thus, pullup 1101 turns off, halting the flow of crowbar current. The voltage level of output signal OUTD falls the rest of the way to ground GND.

Measuring from the midpoints of signals IND and OUTD (i.e., at voltage levels of VDD/2), the time between the rising edge of IND and the falling edge of OUTD is Tpd_HL, as shown in FIG. 11A.

When input signal IND goes low again, a similar situation occurs. At time T3, input signal IND falls below |VTp|, and pullup 1101 turns on while pulldown 1102 is still on. Again, a crowbar current occurs. When the voltage level of input signal IND falls below VTn, pulldown 1102 finally turns off, the crowbar current ceases, and the voltage level of output signal OUTD rises the rest of the way to power high VDD.

Again measuring from the midpoints of signals IND and OUTD, the time between the falling edge of IND and the rising edge of OUTD is Tpd_LH, as shown in FIG. 11A.

In addition to the undesirable crossbar current, which can be quite significant when many signals are switching at the same time, the typical CMOS driver circuit of FIG. 11 has a built-in delay. During the period when both pullup and pulldown are on, there is contention over the voltage level of output terminal OUTD. While pulldown 1102 tries to pull down on the OUTD terminal, pullup 1101 is also trying to pull up on the same terminal. This contention adds to the amount of time required to switch the value of signal OUTD, i.e., adds to the total delay through the driver circuit.

When output terminal OUTD is heavily loaded, driver circuit 1100 will be very slow unless pullup 1101 and pulldown 1102 are made very large. When pullup 1101 and pulldown 1102 are very large, the crowbar current is also very large. Therefore, driver circuit 1100 is generally not suited for driving heavily loaded signals.

Figure 11B:
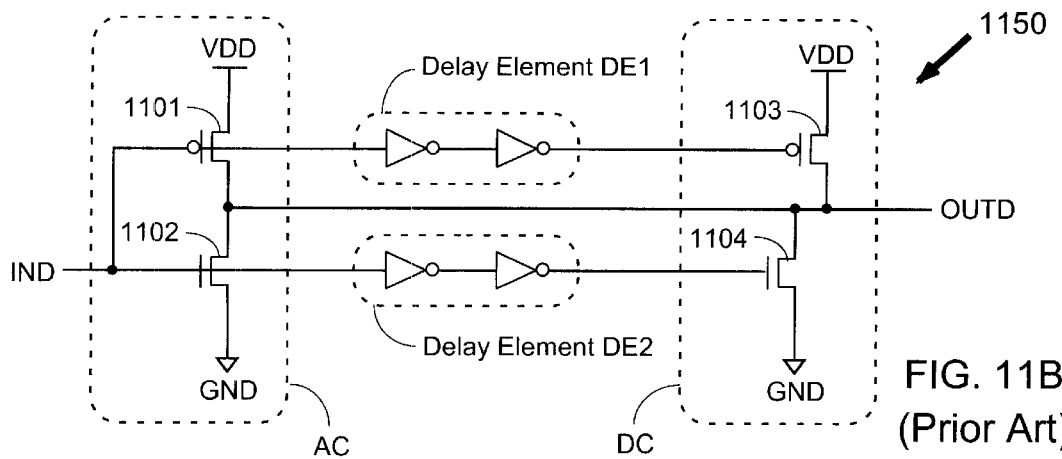
FIG. 11B shows a second prior art driver circuit.

FIG. 11B shows a prior art driver circuit 1150 that is sometimes used to drive heavy loads, such as input/output (I/O) pads in integrated circuits. In driver circuit 1150, the driver is split into two stages, an AC stage including devices 1101 and 1102, and a DC stage including devices 1103 and 1104. The devices in the AC stage are just big enough to switch signal OUTD, passing the VDD/2 voltage level on signal IND to meet the AC specification for the IC. However, the AC device sizes are still large enough to draw a significant crowbar current, often being several hundred microns in width. The DC stage takes effect some time later (delayed by delay elements DE1 and DE2) to supply the large output current necessary to drive heavy loads. In this fashion, the peak current is reduced by separating the crowbar currents of the AC portion and the DC portion of the driver circuit. However, the DC stage, which is the stage with the large transistor sizes, still draws a significant crowbar current whenever signal OUTD changes value.

Driver circuit 1150 includes pullup 1101 and pulldown 1102, similar to driver circuit 1100 of FIG. 11, but also includes pullup 1103, pulldown 1104, and delay elements DE1, DE2. Pullup 1103 and pulldown 1104 are both coupled to output terminal OUTD. Pullup 1103 is gated by input signal IND delayed by delay element DE1. Pulldown 1104 is gated by input signal IND delayed by delay element DE2.

Figure 12:
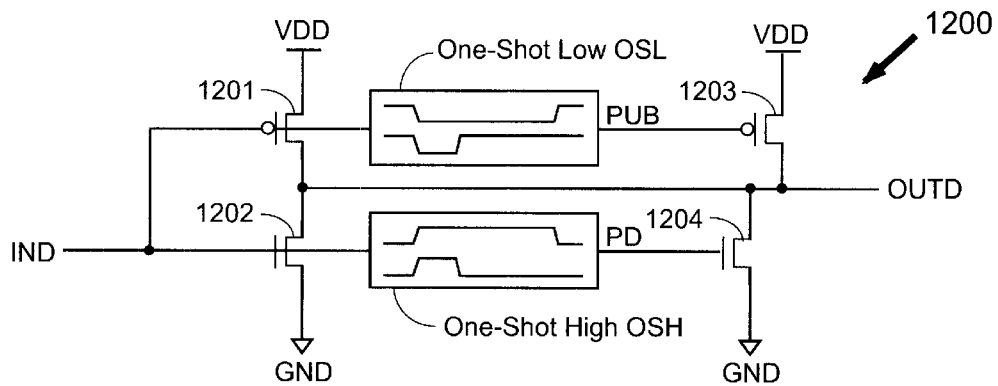
FIG. 12 shows a driver circuit according to one embodiment of the invention.

FIG. 12 shows a driver circuit 1200 according to one aspect of the present invention. Driver circuit 1200 can drive large loads with a much-reduced crowbar current compared to driver circuit 1150 of FIG. 11B.

Driver circuit 1200 includes pullups 1201 and 1203, pulldowns 1202 and 1204, one-shot low OSL, and one-shot high OSH. Pullup 1201 and pulldown 1202 form an inverter driven by input signal IND and driving output signal OUTD. Pullup 1203 and pulldown 1204 are both coupled to output terminal OUTD. One-shot low OSL is driven by input signal IND and has an output terminal PUB coupled to the gate terminal of pullup 1203. One-shot high OSH is driven by input signal IND and has an output terminal PD coupled to the gate terminal of pulldown 1204. In the pictured embodiment, the pullups are implemented as P-channel transistors coupled between output terminal OUTD and power high VDD, and the pulldowns are implemented as N-channel transistors coupled between output terminal OUTD and ground GND.

Figure 12A:
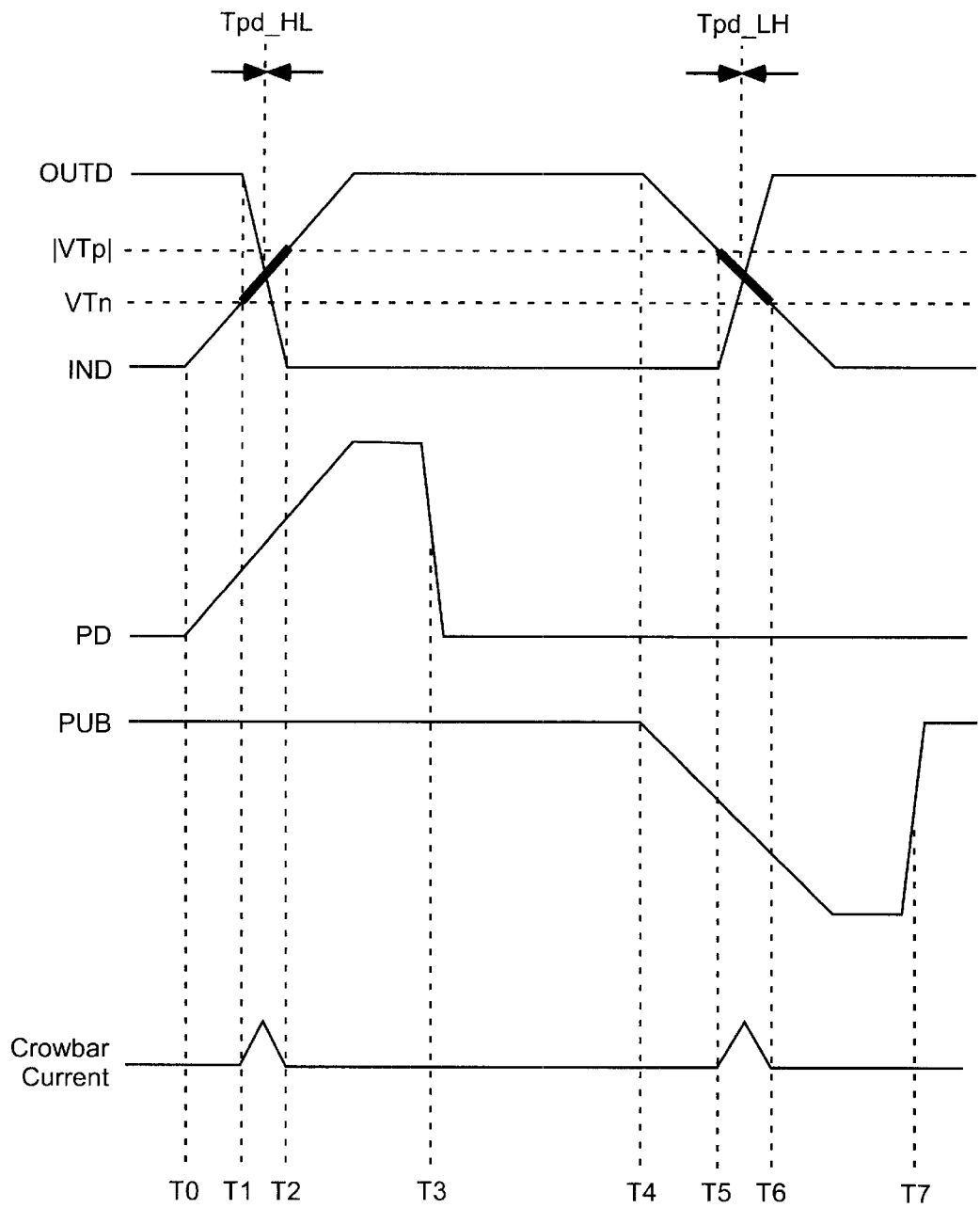
FIG. 12A shows the waveforms associated with the driver circuit of FIG. 12.

Driver circuit 1200 functions as follows, and as shown in FIG. 12A. Initially, input signal IND is low, enabling pullup 1201 and disabling pulldown 1202. Therefore, output signal OUTD is high. Because input signal IND is assumed to have been low for some time, signal PUB is high. Therefore, pullup 1203 is disabled. Signal PD is low, therefore, pulldown 1204 is disabled.

At time T0, input signal IND starts to rise. At time T1, input signal IND rises above the threshold voltage VTn of an N-channel transistor. Pulldown 1202 turns on, but pullup 1201 is also still on. Therefore, a crowbar current passes from ground GND to power high VDD through pulldown 1202 and pullup 1201, as shown in the lower part of FIG. 12A. However, pullup 1201 and pulldown 1202 are small size devices, preferably the minimum size device supported by the fabrication technology. Therefore, the crowbar current is very small compared to the prior art circuit of FIG. 11B.

In response to the rising edge on input signal IND, one-shot high OSH generates a high output pulse at node PD, as shown in FIG. 12A. In response to this high pulse, pulldown 1204 turns on. Because pulldown 1204 is a much larger device than pulldown 1202, most of the current flow is through pulldown 1204. However, the only path to power high VDD at this point is through pullup 1201, which is a small device allowing little current flow. Therefore, the crowbar current is limited by the small size of pullup 1201 and remains very small.

At time T2, the voltage on signal IND rises above the absolute value of the threshold voltage |VTp| of a P-channel transistor. Thus, pullup 1201 turns off, halting the flow of crowbar current.

At time T3, the high pulse on node PD ends, and pulldown 1204 is disabled. The only one of the four devices 1201–1204 now enabled is pulldown 1202, which functions as a keeper circuit to keep output signal OUTD low.

Measuring from the midpoints of signals IND and OUTD, the time between the rising edge of IND and the falling edge of OUTD, Tpd_HL, can be so small as to be negligible. In fact, when measured as described, the through-delay of the circuit can be zero, or even negative. This small through-delay is made possible by the fact that there is no contention taking place between a powerful pullup and a powerful pulldown. Instead, a powerful pulldown (1204) is only in contention with a weak pullup (1201), as described above.

When input signal IND goes low again starting at time T4, a similar situation occurs. At time T5, input signal IND falls below |VTp|, and pullup 1201 turns on while pulldown 1202 is still on. Again, a crowbar current occurs. However, pulldown 1204 is off because signal PD went low at time T3. Therefore, because devices 1201 and 1202 are both of small size, the crowbar current is also small.

In response to the falling edge on input signal IND, one-shot low OSL generates a low output pulse at node PUB, as shown in FIG. 12A. In response to this low pulse, pullup 1203 turns on. Because pullup 1203 is a much larger device than pullup 1201, most of the current flow is through pullup 1203. However, the only path to ground GND at this point is through pulldown 1202, which is a small device allowing little current flow. Therefore, the crowbar current is limited by the small size of pulldown 1202 and remains very small.

At time T6, the voltage on signal IND falls below VTn. Thus, pulldown 1202 turns off, halting the flow of crowbar current. At time T7, the low pulse on node PUB ends as shown in FIG. 12A, and pullup 1103 turns off. The only one of the four devices 1201–1204 now enabled is pullup 1201, which functions as a keeper circuit to keep output signal OUTD high.

The lengths of the pulses generated by one-shot circuits OSL and OSH are preferably calculated based on the output specifications, the loading at output terminal OUTD, and the device sizes of pullup 1203 and pulldown 1204 to complete the charging of the output capacitance during the pulses on node PUB and PD. These calculations are easily performed by one of skill in the art of driver circuit design.

Virtually any one-shot circuit providing a pulse of the desired duration can be used in the driver circuit of FIG. 12, including prior art one-shot circuits. However, the one-shot circuits described herein can be advantageously used to provide driver circuits with higher speed and lower crowbar currents. For example, one-shot high 500 of FIG. 5 can be used as one-shot high OSH, while one-shot low 600 of FIG. 6 is used as one-shot low OSL.

In one embodiment, one-shot high 700 of FIG. 7 is used as one-shot high OSH, while one-shot low 800 of FIG. 8 is used as one-shot low OSL. In this embodiment, the pulse widths on nodes PUB and PD are selectable or programmable. For example, for a more heavily loaded output terminal OUTD, wider pulse widths can be selected, while selecting shorter pulse widths for a less heavily loaded output terminal. As another example, the pulse widths can be adjusted to compensate for process shifts.

According to one embodiment, driver circuit 1200 is included in a programmable logic device (PLD) such as an FPGA or a CPLD. In this embodiment, values for the various select signals are stored in configuration memory cells and configured along with the other configuration memory cells in the device.

Figure 13:
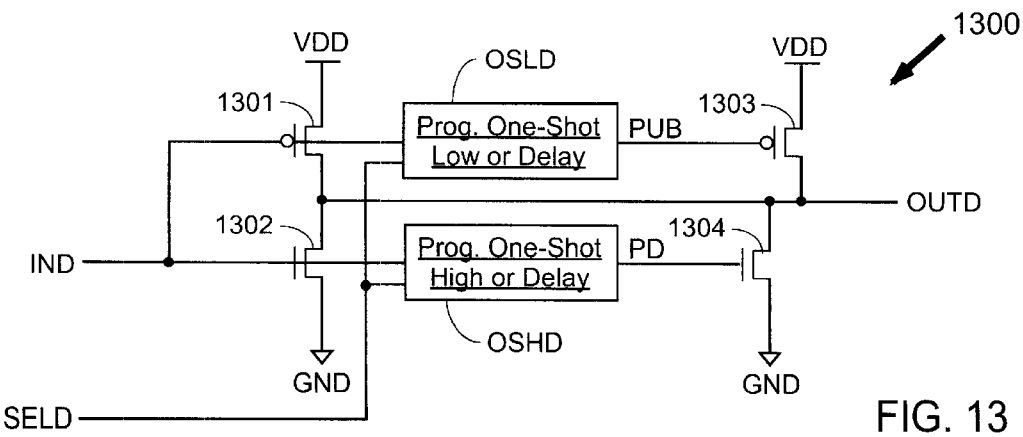
FIG. 13 shows a programmable driver circuit according to one embodiment of the invention.

FIG. 13 shows an embodiment in which programmable one-shots are used that can be programmed to function as delay elements. Driver circuit 1300 is similar to driver circuit 1200 of FIG. 12, except that one-shot low OSLD can be programmed to function as a delay element, e.g., similar to delay element DE1 of FIG. 11B, and one-shot high OSHD can be programmed to function as a delay element, e.g., similar to delay element DE2 of FIG. 11B. Thus, driver circuit 1300 can be programmed to function as either driver circuit 1200 or driver circuit 1150.

In the embodiment of FIG. 13, for example, one-shot high 900 of FIG. 9 can be used as one-shot high OSHD, while one-shot low 1000 of FIG. 10 is used as one-shot low OSLD.

Figure 14:
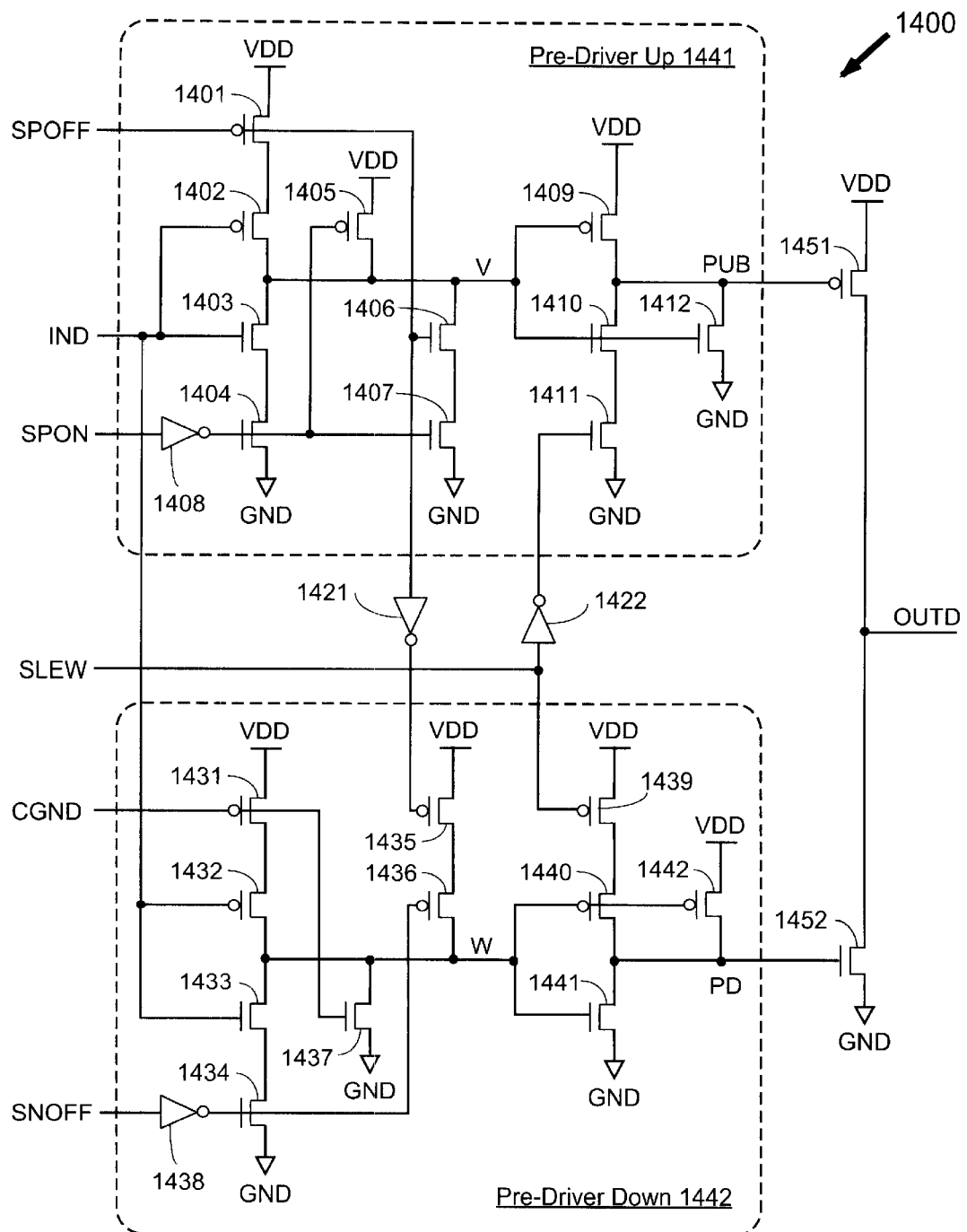
FIG. 14 shows a prior art driver circuit including two pre-driver circuits.

For particularly heavily loads, driver circuits such as that shown in FIG. 14 are often used. FIG. 14 shows a known I/O driver circuit 1400. The circuit includes two pre-driver circuits, a first "pre-driver up" 1441 driving the output pullup 1451 and a second "pre-driver down" 1442 driving the output pulldown 1452. Pullup 1451 is a very large P-channel transistor, while pulldown 1452 is a very large N-channel transistor. Because the output devices in an I/O circuit are very large, they have a large capacitance, and pre-driver circuits are generally provided to drive them at a reasonable speed.

Pre-driver up circuit 1441 includes P-channel transistors 1401–1402, 1405, and 1409, N-channel transistors 1403–1404, 1406–1407, and 1410–1412, and inverter 1408. Transistors 1401 and 1402 are coupled in series between power high VDD and an internal node V, while transistors 1403 and 1404 are coupled in series between node V and ground GND. Transistors 1406 and 1407 are also coupled in series between node V and ground GND, while transistor 1405 is coupled between power high VDD and node V. Transistors 1401 and 1406 are gated by control signal SPOFF. Transistors 1402 and 1403 are gated by input signal IND. Transistors 1404–1405 and 1407 are gated by control signal SPON inverted by inverter 1408.

Transistor 1409 is coupled between power high VDD and output node PUB. Transistors 1410 and 1411 are coupled in series between output node PUB and ground GND. Transistor 1412 is coupled between output node PUB and ground GND. Transistors 1409–1410 and 1412 are gated by node V. Transistor 1411 is gated by control signal SLEW inverted by inverter 1422.

The behavior of pre-driver up circuit 1441 depends on the values of the control signals SPOFF and SPON, as shown in Table 3. When the pre-driver circuit is configured as a driver, control signal SLEW controls the output slew rate. In addition, in one selectable state the value of control signals SNOFF and CGND are of significance, as described below and as shown in Table 3. An "x" entry in Table 3 denotes a "don't-care" value.

TABLE 3

| SPOFF | SPON | SNOFF | CGND | Pre-Driver Up Function |
|---|---|---|---|---|
| 0 | 0 | x | x | Non-inverting Driver (PUB = IND) |
| 1 | 0 | x | x | Output PUB High |
| 1 | 1 | 1 | 0 | Output PUB Low |

Signal SLEW controls the slew rate of the output signal, e.g., the rate at which signal OUTD goes high through pullup 1451, which is in turn controlled by the rate at which signal PUB goes low. When signal SLEW is high, transistor 1411 is turned off, and only the path through transistor 1412 is available to drive node PUB low. Transistor 1412 is generally made much smaller than the equivalent transistor size of transistors 1410 and 1411 combined, therefore the path through transistor 1412 is much slower than the path through the other two transistors. Thus, the slew rate of output signal OUTD is reduced. When signal SLEW is low, transistor 1411 is turned on, and both paths through transistors 1412 and 1410 are available. Hence, the slew rate of output signal OUTD is increased.

Control signals SPOFF and SPON can be used to disable pullup 1451 entirely, i.e., to ensure that signal OUTD is not pulled up by driver circuit 1400. When signal SPOFF is high and signal SPON is low, node V is pulled low through transistors 1406–1407. Because node V is low, node PUB is pulled high through transistor 1409. Thus, the pullup 1451 on output node OUTD is disabled.

When control signal SPON is high, node V is pulled high through transistor 1405. Therefore, node PUB is pulled low, and pullup 1451 on output node OUTD is enabled. Therefore, the pulldown 1452 on output node OUTD must be disabled when signal SPON is high. This is accomplished by driving signals SNOFF and SPOFF high and signal CGND low, as described below and as shown in Table 3.

When both of signals SPOFF and SPON are low, transistors 1401 and 1404 are on and transistors 1405 and 1406 are both off. Thus, node V is simply the inverse of input signal IND. Pre-driver up circuit 1441 behaves as a non-inverting driver circuit with a slew rate controlled by signal SLEW.

Pre-driver down circuit 1442 includes P-channel transistors 1431–1432, 1435–1436, 1439–1440, and 1442, N-channel transistors 1433–1434, 1437, and 1441, and inverter 1438. Transistors 1431 and 1432 are coupled in series between power high VDD and an internal node W, while transistors 1433 and 1434 are coupled in series between node W and ground GND. Transistors 1435 and 1436 are also coupled in series between power high VDD and node W, while transistor 1437 is coupled between node W and ground GND. Transistors 1431 and 1437 are gated by control signal CGND. Transistors 1432 and 1433 are gated by input signal IND. Transistors 1434 and 1436 are gated by control signal SNOFF inverted by inverter 1438. Transistor 1435 is gated by control signal SPOFF inverted by inverter 1421.

Transistors 1439 and 1440 are coupled in series between power high VDD and output node PD. Transistor 1441 is coupled between output node PD and ground GND. Transistor 1442 is coupled between power high VDD and output node PD. Transistors 1440–1442 are gated by node W. Transistor 1439 is gated by control signal SLEW.

The behavior of pre-driver down circuit 1442 depends on the values of the control signals CGND, SNOFF, and SPOFF, as shown in Table 4. When the pre-driver circuit is configured as a driver, signal SLEW controls the output slew rate. In addition, in one selectable state the value of signal SPON is of significance, as described below and as shown in Table 4. An "x" entry in Table 4 denotes a "don't-care" value.

TABLE 4

| CGND | SNOFF | SPOFF | SPON | Pre-Driver Down Function |
|---|---|---|---|---|
| 0 | 0 | x | x | Non-inverting Driver (PD = IND) |
| 0 | 1 | 1 | x | Output PD Low |
| 1 | 0 | 1 | 0 | Output PD High |

As in pre-driver up circuit 1441, signal SLEW controls the slew rate of the output signal, in this case the rate at which signal OUTD goes low through pulldown 1452. This rate in turn is controlled by the rate at which signal PD goes high. When signal SLEW is high, transistor 1439 is turned off, and only the path through transistor 1442 is available to drive node PD high. Transistor 1442 is generally made much smaller than the equivalent transistor size of transistors 1439 and 1440 combined, therefore the path through transistor 1442 is much slower than the path through the other two transistors. Thus, the slew rate of output signal OUTD is reduced. When signal SLEW is low, transistor 1439 is turned on, and both paths through transistors 1442 and 1440 are available. Hence, the slew rate of output signal OUTD is increased.

Signals CGND, SNOFF, and SPOFF can be used to disable pulldown 1452 entirely, i.e., to ensure that signal OUTD is not pulled down by driver circuit 1400. When signals SNOFF and SPOFF are both high, node W is pulled high through transistors 1435–1436. Signal CGND must also be low, to prevent node W from being pulled low through transistor 1437. Because node W is high, node PD is pulled low through transistor 1441. Thus, the pulldown 1452 on output node OUTD is disabled.

When signal CGND is high, node W is pulled low through transistor 1437. (Signals SPOFF and SNOFF must not both be high when signal CGND is high, or there will be contention at node W because of the path to power high VDD through transistors 1435–1436.) Because node W is low, node PD is pulled high. Thus, the pulldown 1452 on output node OUTD is enabled. Therefore, the pullup 1451 on output node OUTD must be disabled. This is accomplished by driving signal SPOFF high and signal SPON low, as described above and as shown in Table 3. Because signals SPOFF and SNOFF must not both be high, and signal SPOFF is high, signal SNOFF must be low in this configuration.

When both of signals CGND and SNOFF are low, transistors 1431 and 1434 are on and transistors 1437 and 1436 are both off. Thus, node W is simply the inverse of input signal IND. Pre-driver down circuit 1442 behaves as a non-inverting driver circuit with a slew rate controlled by signal SLEW.

The driver circuit of FIG. 14 can be configured to provide several different configurations for driver circuit 1400, as shown in Table 5. (In inverting driver mode, control signal SLEW controls the slew rate, as described above.) However, the I/O driver circuit of FIG. 14 does not address the issue of high crowbar current, because when both pre-driver circuits are configured as non-inverting drivers, driver circuit 1400 is essentially similar to driver circuit 1150 of FIG. 11B.

TABLE 5

| SPOFF | SPON | SNOFF | CGND | PUB | PD | SLEW | Driver Function |
|---|---|---|---|---|---|---|---|
| 0 | 0 | 0 | 0 | IND | IND | 1 | Inverting Driver (Slow Slew) |
| 0 | 0 | 0 | 0 | IND | IND | 0 | Inverting Driver (Fast Slew) |
| 1 | 0 | 1 | 0 | 1 | 0 | x | OUTD = Tristate |
| 1 | 1 | 1 | 0 | 0 | 0 | x | OUTD = High |
| 1 | 0 | 0 | 1 | 1 | 1 | x | OUTD = Low |

Figure 15:
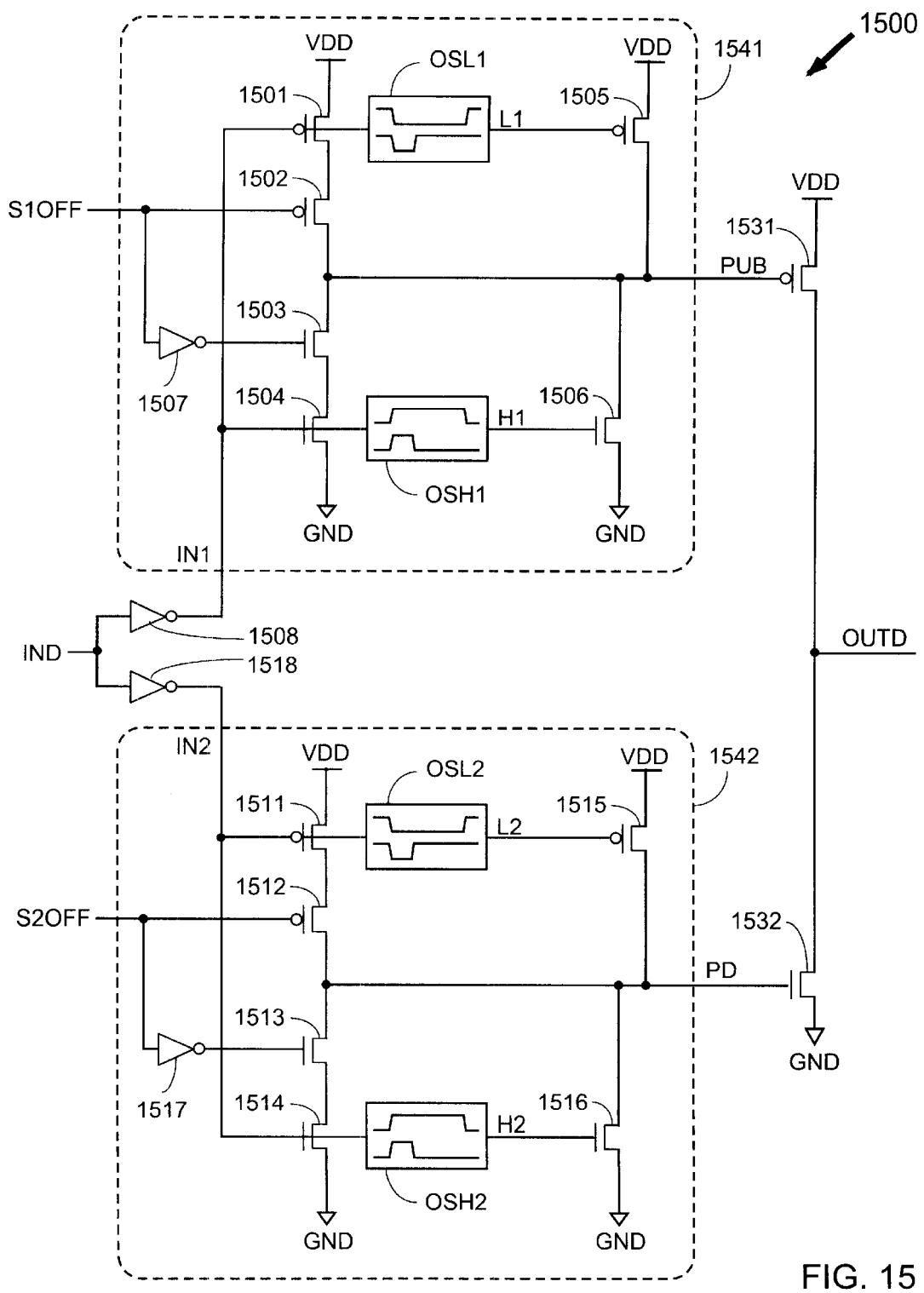
FIG. 15 shows a driver circuit including two pre-driver circuits according to one embodiment of the invention.

FIG. 15 shows an I/O driver circuit in which each pre-driver circuit includes two programmable one-shot circuits. Each pre-driver circuit 1541 and 1542 is similar to the driver circuits shown in FIGS. 12 and 13. However, a disabling capability has been added to each pre-driver and each one shot (OSL1, OSH1, OSL2, OSH2) can be programmed to provide high output signal, a low output signal, or to function as a one-shot as previously described.

To provide the disabling capability in pre-driver up 1541, an N-channel transistor 1503 is added in the inverter pulldown path, while a P-channel transistor 1502 is added in the pullup path. P-channel transistor 1502 is gated by control signal S1OFF, while N-channel transistor 1503 is gated by control signal S1OFF inverted by inverter 1507. Thus, when signal S1OFF is high, there is no current flow through either of transistors 1501 and 1504. A similar modification is made to pre-driver down 1542.

Figure 15A:
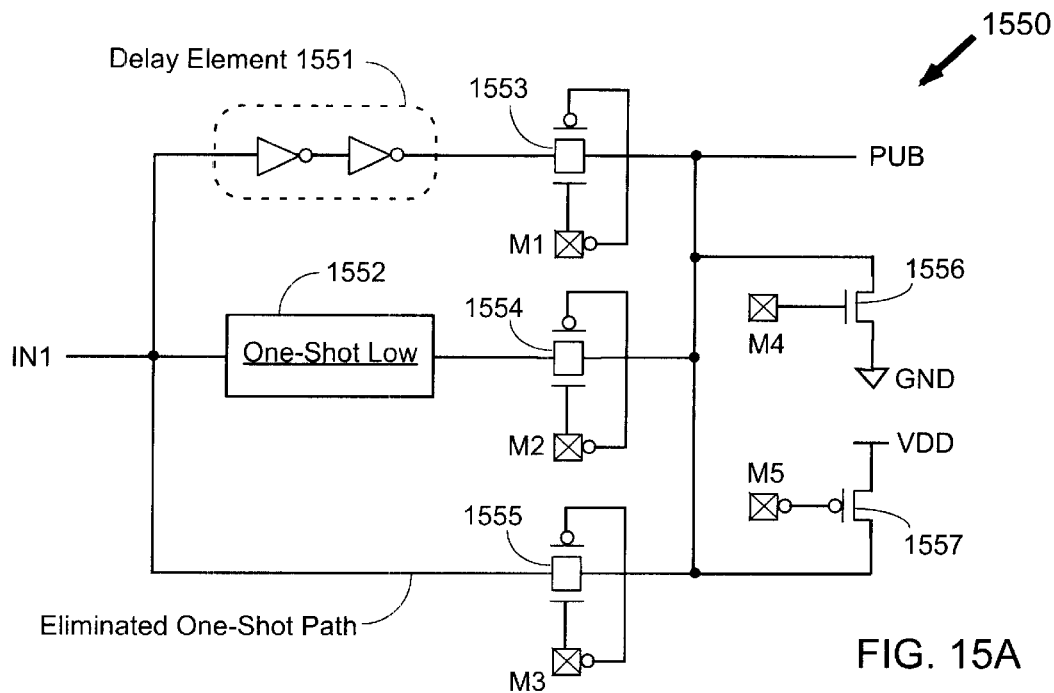
FIG. 15A shows a programmable embodiment of the one-shot low circuit used in FIG. 15.

FIG. 15A shows one programmable one-shot circuit that can be used in the embodiment of FIG. 15 to implement circuits OSL1 and OSL2. In other embodiments, other programmable one-shot low circuits are used that do not include the delay element option and the eliminated one-shot path option. Other implementations of a programmable one-shot low can also be used, as long as they offer the options of acting as a one-shot low, providing a high output signal, and providing a low output signal. Many implementations of such one-shot low circuits will occur to those of ordinary skill in the relevant arts.

Circuit 1550 of FIG. 15A has five programmable functions, in addition to any programmable functions included in circuit 1552. In the pictured embodiment, these functions are controlled by programmable memory cells M1–M5. In other embodiments, the functions are controlled by input signals or signals stored in memory elements other than configuration memory cells. The functions include: a delay line function implemented using a delay element 1551 and a pass gate 1553 controlled by memory cell M1; a one-shot low function using a one-shot low circuit 1552 and a pass gate 1554 controlled by memory cell M2; an eliminated one-shot path (one-shot bypass) using a pass gate 1555 controlled by memory cell M3; a connection to ground GND through N-channel transistor 1556 controlled by memory cell M4; and a connection to power high VDD through P-channel transistor 1557 controlled by memory cell M5.

Figure 15B:
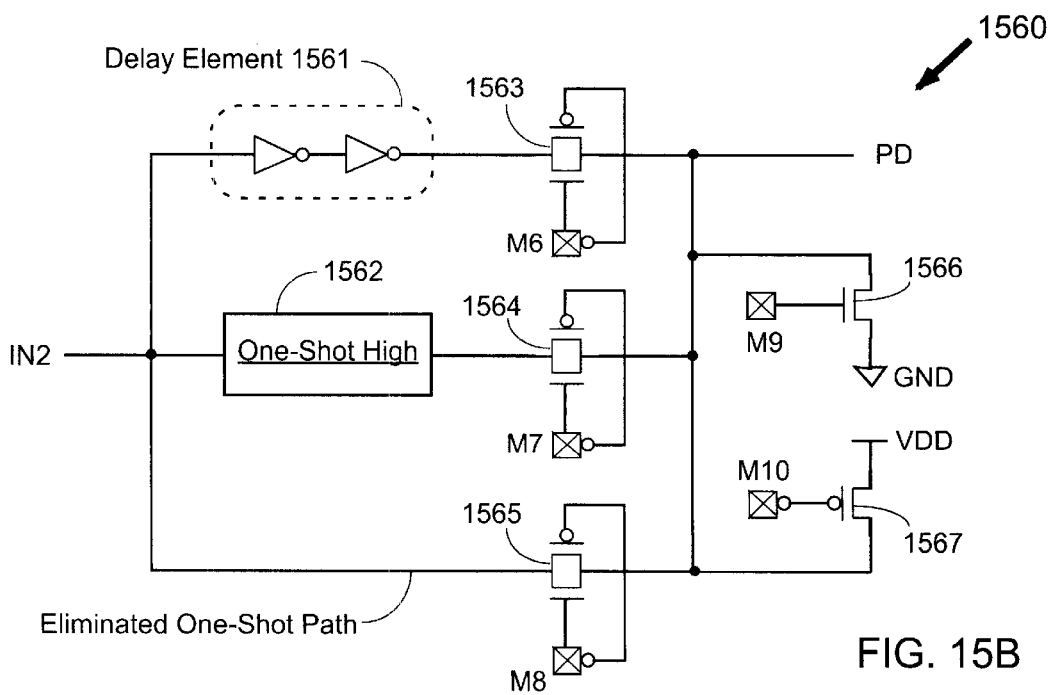
FIG. 15B shows a programmable embodiment of the one-shot high circuit used in FIG. 15.

FIG. 15B shows a programmable one-shot high that can be used in the embodiment of FIG. 15 to implement circuits OSH1 and OSH2. In other embodiments, other one-shot high circuits are used that do not include the delay element option and the eliminated one-shot path option. Other implementations of a programmable one-shot high can also be used, as long as they offer the options of acting as a one-shot high, providing a high output signal, and providing a low output signal. Many implementations of such one-shot high circuits will occur to those of ordinary skill in the relevant arts.

Circuit 1560 of FIG. 15B has five programmable functions, in addition to any programmable functions included in circuit 1562. These functions are controlled by programmable memory cells M6–M10. In other embodiments, the functions are controlled by input signals or signals stored in memory elements other than configuration memory cells. The functions include: a delay line function implemented using a delay element 1561 and a pass gate 1563 controlled by memory cell M6; a one-shot high function using a one-shot high circuit 1562 and a pass gate 1564 controlled by memory cell M7; an eliminated one-shot path (one-shot bypass) using a pass gate 1565 controlled by memory cell M8; a connection to ground GND through N-channel transistor 1566 controlled by memory cell M9; and a connection to power high VDD through P-channel transistor 1567 controlled by memory cell M10.

In one embodiment, driver circuit 1500 is implemented as part of a programmable logic device (PLD), and memory cells M1–M10 form a portion of the configuration memory for the PLD. Thus, the values stored in the memory cells are loaded as part of the configuration data used to configure the PLD.

Returning to FIG. 15, the functionality of driver circuit 1500 is as shown in Table 6. In Table 6, the notation "En" in the column below a signal name indicates that the one-shot providing the signal is programmed to function as a one-shot, while the notations "1" and "0" indicate that the associated one-shot is programmed to provide a high or low output signal, respectively.

TABLE 6

| S1OFF | L1 | H1 | PUB | S2OFF | L2 | H2 | PD | Driver Function |
|---|---|---|---|---|---|---|---|---|
| 0 | En | En | IND | 0 | En | En | IND | Inverting Driver |
| 1 | 0 | 0 | 1 | 1 | 1 | 1 | 0 | OUTD = Tristate |
| 1 | 0 | 0 | 1 | 1 | 0 | 0 | 1 | OUTD = Low |
| 1 | 1 | 1 | 0 | 1 | 1 | 1 | 0 | OUTD = High |

In another embodiment (not shown), a driver circuit similar to driver circuit 1500 is provided that has a programmable slew rate. This capability is provided in a fashion similar to that used in FIG. 14.

Figure 16:
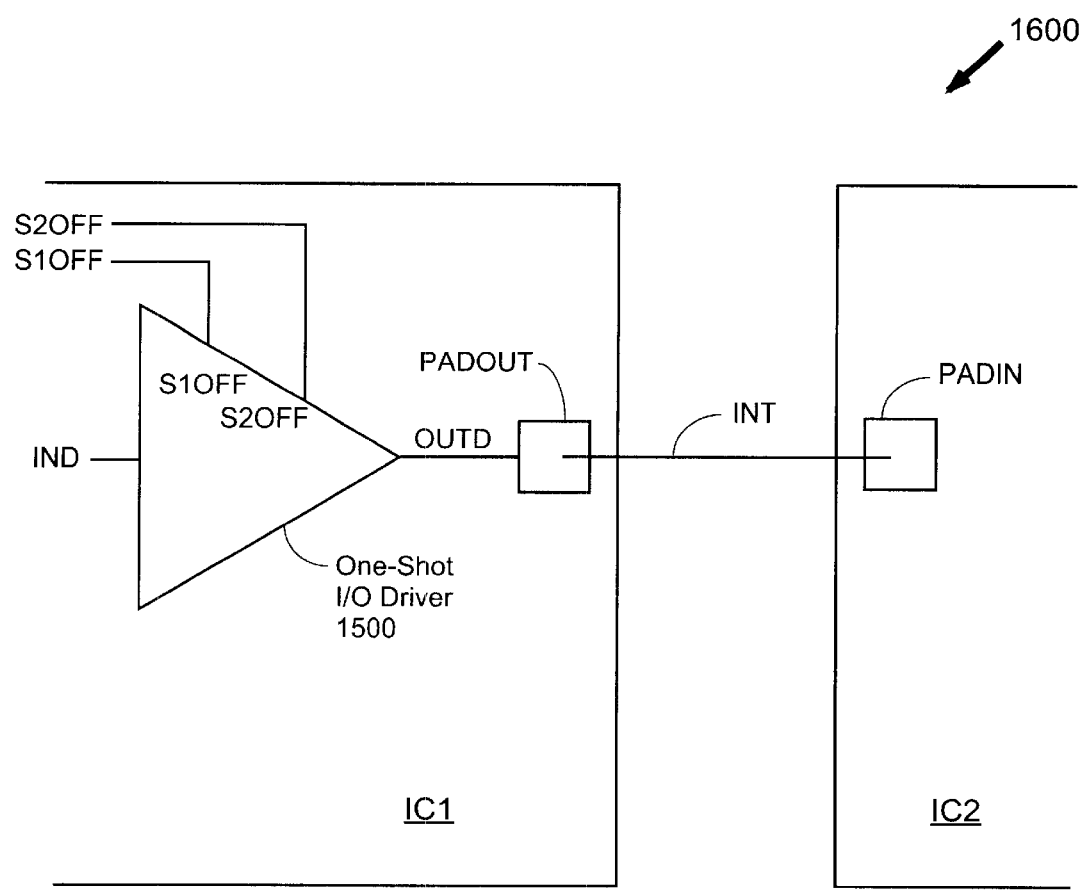
FIG. 16 shows an electronic system including an output driver circuit according to one embodiment of the invention.

FIG. 16 illustrates another aspect of the invention, showing an electronic system 1600 in which driver circuit 1500 of FIG. 15 is used to drive a signal between two ICs in the system. Driver circuit 1500 forms a portion of a first IC IC1. Driver circuit 1500 provides an output signal OUTD to an output pad PADOUT of the first IC IC1. An interconnect wire INT in the system 1600 delivers signal OUTD to an input pad PADIN in the second IC IC2. Thus, driver circuit 1500 facilitate fast and low-current communication between and among various ICs in an electronic system.

Those having skill in the relevant arts of the invention will now perceive various modifications and additions that can be made as a result of the disclosure herein. For example, the above text describes the circuits of the invention in the context of ICs such as programmable logic devices (PLDs). However, the circuits of the invention can also be implemented in other electronic systems, for example, in non-programmable ICs or in printed circuit boards including discrete devices.

Further, pullups, pulldowns, transistors, P-channel transistors, N-channel transistors, pass gates, delay elements, delay lines, delay chains, AND circuits, NAND circuits, NAND gates, OR circuits, NOR circuits, NOR gates, inverters, one-shots, programmable one-shots, one-shot highs, one-shot lows, multiplexers, memory cells, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A driver circuit, comprising:
a driver input terminal;
a driver output terminal;
a first inverter having an input terminal coupled to the driver input terminal and further having an output terminal coupled to the driver output terminal;
a first one-shot having an input terminal coupled to the driver input terminal and further having an output terminal;
a second one-shot having an input terminal coupled to the driver input terminal and further having an output terminal;
a first pullup coupled to the driver output terminal and having a control terminal coupled to the output terminal of the first one-shot; and
a first pulldown coupled to the driver output terminal and having a control terminal coupled to the output terminal of the second one-shot.

2. The driver circuit of claim 1, wherein the first and second one-shots are programmable.

3. The driver circuit of claim 2, wherein the first and second one-shots each comprise programmable means for disabling a one-shot function and enabling a delay function.

4. The driver circuit of claim 2, wherein the first and second one-shots each comprise programmable means for disabling a one-shot function and enabling a pass gate function.

5. The driver circuit of claim 2, wherein at least one of the first and second one-shots comprises programmable means for coupling the associated one-shot output terminal to a ground.

6. The driver circuit of claim 2, wherein at least one of the first and second one-shots comprises programmable means for coupling the associated one-shot output terminal to a power high.

7. The driver circuit of claim 1, wherein:
the first one-shot is a one-shot low;
the first pullup is a P-channel transistor coupled between a power high and the driver output terminal;
the second one-shot is a one-shot high; and
the first pulldown is an N-channel transistor coupled between the driver output terminal and a ground.

8. The driver circuit of claim 7, wherein the first one-shot comprises:
a non-inverting delay element having an input terminal coupled to the input terminal of the first one-shot and further having an output terminal;
a plurality of OR circuits coupled in series from a first OR circuit to a last OR circuit, the first OR circuit having a first input terminal coupled to the output terminal of the delay element, and a remainder of the OR circuits having a first input terminal coupled to an output terminal of a previous OR circuit, each OR circuit having a second input terminal coupled to the input terminal of the first one-shot; and
an output circuit having a first input terminal coupled to the input terminal of the first one-shot, a second input terminal coupled to an output terminal of the last OR circuit, and an output terminal coupled to the output terminal of the first one-shot.

9. The driver circuit of claim 8, wherein the output circuit comprises:
a first pass gate coupled between the input terminal and the output terminal of the first one-shot and having a control terminal coupled to the output terminal of the last OR circuit; and a second pullup coupled to the output terminal of the first one-shot and having a control terminal coupled to the output terminal of the last OR circuit.

10. The driver circuit of claim 9, wherein the output circuit is programmable.

11. The driver circuit of claim 7, wherein the second one-shot comprises:

a non-inverting delay element having an input terminal coupled to the input terminal of the second one-shot and further having an output terminal;

a plurality of AND circuits coupled in series from a first AND circuit to a last AND circuit, the first AND circuit having a first input terminal coupled to the output terminal of the delay element, and a remainder of the AND circuits having a first input terminal coupled to an output terminal of a previous AND circuit, each AND circuit having a second input terminal coupled to the input terminal of the second one-shot; and an output circuit having a first input terminal coupled to the input terminal of the second one-shot, a second input terminal coupled to an output terminal of the last AND circuit, and an output terminal coupled to the output terminal of the second one-shot.

12. The driver circuit of claim 11, wherein the output circuit comprises:

a first pass gate coupled between the input terminal and the output terminal of the second one-shot and having a control terminal coupled to the output terminal of the last AND circuit; and a pulldown coupled to the output terminal of the second one-shot and having a control terminal coupled to the output terminal of the last AND circuit.

13. The driver circuit of claim 12, wherein the output circuit is programmable.

14. A driver circuit, comprising:

a driver input terminal;

a driver output terminal;

a first pre-driver circuit having an input terminal coupled to the driver input terminal and an output terminal;

a second pre-driver circuit having an input terminal coupled to the driver input terminal and an output terminal;

a first pullup coupled to the driver output terminal and having a control terminal coupled to the output terminal of the first pre-driver circuit; and a first pulldown coupled to the driver output terminal and having a control terminal coupled to the output terminal of the second pre-driver circuit, wherein the first and second pre-driver circuits each comprise:

a first inverter having an input terminal coupled to the input terminal of the pre-driver circuit and further having an output terminal coupled to the output terminal of the pre-driver circuit;

a first one-shot having an input terminal coupled to the input terminal of the pre-driver circuit and further having an output terminal;

a second one-shot having an input terminal coupled to the input terminal of the pre-driver circuit and further having an output terminal;

a second pullup coupled to the output terminal of the pre-driver circuit and having a control terminal coupled to the output terminal of the first one-shot; and a second pulldown coupled to the output terminal of the pre-driver circuit and having a control terminal coupled to the output terminal of the second one-shot.

15. The driver circuit of claim 14, wherein the driver circuit is an output driver circuit for an integrated circuit (IC) device.

16. The driver circuit of claim 14, wherein in each of the first and second pre-driver circuits:

the first one-shot is a one-shot low;

the second pullup is a P-channel transistor coupled between a power high and the output terminal of the pre-driver circuit;

the second one-shot is a one-shot high; and the second pulldown is an N-channel transistor coupled between the output terminal of the pre-driver circuit and a ground.

17. The driver circuit of claim 16, wherein in each of the first and second pre-driver circuits the first one-shot comprises:

a non-inverting delay element having an input terminal coupled to the input terminal of the first one-shot and further having an output terminal;

a plurality of OR circuits coupled in series from a first OR circuit to a last OR circuit, the first OR circuit having a first input terminal coupled to the output terminal of the delay element, and a remainder of the OR circuits having a first input terminal coupled to an output terminal of a previous OR circuit, each OR circuit having a second input terminal coupled to the input terminal of the first one-shot; and an output circuit having a first input terminal coupled to the input terminal of the first one-shot, a second input terminal coupled to an output terminal of the last OR circuit, and an output terminal coupled to the output terminal of the first one-shot.

18. The driver circuit of claim 17, wherein the output circuit comprises:

a first pass gate coupled between the input terminal and the output terminal of the first one-shot and having a control terminal coupled to the output terminal of the last OR circuit; and a third pullup coupled to the output terminal of the first one-shot and having a control terminal coupled to the output terminal of the last OR circuit.

19. The driver circuit of claim 18, wherein the output circuit is programmable.

20. The driver circuit of claim 16, wherein in each of the first and second pre-driver circuits the second one-shot comprises:

a non-inverting delay element having an input terminal coupled to the input terminal of the second one-shot and further having an output terminal;

a plurality of AND circuits coupled in series from a first AND circuit to a last AND circuit, the first AND circuit having a first input terminal coupled to the output terminal of the delay element, and a remainder of the AND circuits having a first input terminal coupled to an output terminal of a previous AND circuit, each AND circuit having a second input terminal coupled to the input terminal of the second one-shot; and an output circuit having a first input terminal coupled to the input terminal of the second one-shot, a second input terminal coupled to an output terminal of the last AND circuit, and an output terminal coupled to the output terminal of the second one-shot.

21. The driver circuit of claim 20, wherein the output circuit comprises:
  a first pass gate coupled between the input terminal and the output terminal of the second one-shot and having a control terminal coupled to the output terminal of the last AND circuit; and
  a third pulldown coupled to the output terminal of the second one-shot and having a control terminal coupled to the output terminal of the last AND circuit.

22. The driver circuit of claim 21, wherein the output circuit is programmable.

23. An electronic system, comprising:
  a first integrated circuit (IC) comprising an output pad and a driver circuit having an output terminal coupled to the output pad;
  a second IC having an input pad; and
  an interconnect coupling the output pad to the input pad, wherein the driver circuit comprises:
    a driver input terminal;
    a first pre-driver circuit having an input terminal coupled to the driver input terminal and an output terminal;
    a second pre-driver circuit having an input terminal coupled to the driver input terminal and an output terminal;
    a first pullup coupled to the output terminal of the driver circuit and having a control terminal coupled to the output terminal of the first pre-driver circuit; and
    a first pulldown coupled to the output terminal of the driver circuit and having a control terminal coupled to the output terminal of the second pre-driver circuit,
    wherein the first and second pre-driver circuits each comprise:
      a first inverter having an input terminal coupled to the input terminal of the pre-driver circuit and further having an output terminal coupled to the output terminal of the pre-driver circuit;
      a first one-shot having an input terminal coupled to the input terminal of the pre-driver circuit and further having an output terminal;
      a second one-shot having an input terminal coupled to the input terminal of the pre-driver circuit and further having an output terminal;
      a second pullup coupled to the output terminal of the pre-driver circuit and having a control terminal coupled to the output terminal of the first one-shot; and
      a second pulldown coupled to the output terminal of the pre-driver circuit and having a control terminal coupled to the output terminal of the second one-shot.

24. The electronic system of claim 23, wherein in each of the first and second pre-driver circuits:
  the first one-shot is a one-shot low;
  the second pullup is a P-channel transistor coupled between a power high and the output terminal of the pre-driver circuit;
  the second one-shot is a one-shot high; and
  the second pulldown is an N-channel transistor coupled between the output terminal of the pre-driver circuit and a ground.

25. The electronic system of claim 23, wherein the driver circuit is programmable.

26. The electronic system of claim 25, wherein the first IC is a programmable logic device (PLD), and the driver circuit is programmed by configuration data stored in configuration memory cells of the PLD.

27. The electronic system of claim 23, wherein the driver circuit is a tristateable driver circuit.

* * * * *